(12) United States Patent
Rosti

(10) Patent No.: US 11,074,988 B2
(45) Date of Patent: Jul. 27, 2021

(54) APPARATUS AND METHODS FOR DEBUGGING ON A HOST AND MEMORY DEVICE

(71) Applicant: Micron Technology, Inc., Boise, ID (US)

(72) Inventor: Shawn Rosti, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 64 days.

(21) Appl. No.: 16/532,778

(22) Filed: Aug. 6, 2019

(65) Prior Publication Data

US 2021/0043266 A1 Feb. 11, 2021

Related U.S. Application Data

(63) Continuation of application No. 15/077,171, filed on Mar. 22, 2016, now Pat. No. 10,388,393.

(51) Int. Cl.
  *G11C 29/00* (2006.01)
  *G11C 29/38* (2006.01)
  *G11C 7/08* (2006.01)
  *G06F 9/22* (2006.01)

(52) U.S. Cl.
  CPC .............. *G11C 29/38* (2013.01); *G06F 9/226* (2013.01); *G11C 7/08* (2013.01)

(58) Field of Classification Search
  None
  See application file for complete search history.

(56) References Cited

U.S. PATENT DOCUMENTS

| 4,380,046 A | 4/1983 | Fung |
| 4,435,792 A | 3/1984 | Bechtolsheim |
| 4,435,793 A | 3/1984 | Ochii |

(Continued)

FOREIGN PATENT DOCUMENTS

| CN | 102141905 | 8/2011 |
| EP | 0214718 | 3/1987 |

(Continued)

OTHER PUBLICATIONS

A. Silvagni, G. Fusillo, R. Ravasio, M. Picca and S. Zanardi, "An overview of logic architectures inside flash memory devices," in Proceedings of the IEEE, vol. 91, No. 4, pp. 569-580, Apr. 2003, doi: 10.1109/JPROC.2003.811707. (Year: 2003).*

(Continued)

*Primary Examiner* — Daniel F. McMahon
(74) *Attorney, Agent, or Firm* — Brooks, Cameron & Huebsch, PLLC

(57) ABSTRACT

Apparatus and methods for debugging on a host and memory device include an example apparatus comprising a memory device having an array of memory cells. Sensing circuitry is coupled to the array. The sensing circuitry includes a sense amplifier and a compute component configured to perform logical operations on the memory device. A controller is coupled to the array and sensing circuitry, the controller is configured to control performance of the logical operations. An interface is configured to receive a debugging indication and to cause the controller to halt a logical operation on the memory device.

17 Claims, 9 Drawing Sheets

(56) References Cited

U.S. PATENT DOCUMENTS

| | | |
|---|---|---|
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffmann et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,085,336 A * | 7/2000 | Swoboda .............. G06F 11/00 714/30 |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,314,530 B1 * | 11/2001 | Mann .................... G06F 11/348 714/25 |
| 6,351,789 B1 | 2/2002 | Green |
| 6,389,507 B1 | 5/2002 | Sherman |
| 6,418,498 B1 | 7/2002 | Martwick |
| 6,466,499 B1 | 10/2002 | Blodgett |
| 6,499,123 B1 | 12/2002 | McFarland et al. |
| 6,510,098 B1 | 1/2003 | Taylor |
| 6,522,985 B1 * | 2/2003 | Swoboda .............. G06F 8/41 702/108 |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazarichuk et al. |
| 6,948,056 B1 | 9/2005 | Roth et al. |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,676,709 B2 | 3/2010 | Chan |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mohklesi |
| 8,059,438 B2 | 11/2011 | Chang et al. |
| 8,095,825 B2 | 1/2012 | Hirotsu et al. |
| 8,112,730 B2 | 2/2012 | Aleksanyan et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |

(56) References Cited

U.S. PATENT DOCUMENTS

| | | |
|---|---|---|
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,885,426 B1 | 11/2014 | Burstein et al. |
| 8,964,496 B2 | 2/2015 | Manning |
| 8,971,124 B1 | 3/2015 | Manning |
| 9,015,390 B2 | 4/2015 | Klein |
| 9,032,264 B2 | 5/2015 | Hashimoto |
| 9,047,193 B2 | 6/2015 | Lin et al. |
| 9,165,023 B2 | 10/2015 | Moskovich et al. |
| 9,460,799 B1 | 10/2016 | Costa et al. |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0013918 A1* | 1/2002 | Swoboda ............... G06F 11/261 714/30 |
| 2002/0059355 A1 | 5/2002 | Peleg et al. |
| 2003/0167426 A1 | 9/2003 | Slobodnik |
| 2003/0214853 A1 | 11/2003 | Hosono et al. |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0213060 A1 | 10/2004 | Naso et al. |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2005/0114638 A1* | 5/2005 | Chen ................... G06F 9/30094 712/244 |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2006/0294312 A1 | 12/2006 | Walmsley |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0130386 A1 | 6/2008 | Pyeon |
| 2008/0137388 A1 | 6/2008 | Krishnan et al. |
| 2008/0148115 A1 | 6/2008 | Sokolov et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0235059 A1* | 9/2009 | Moyer ................ G06F 9/30181 712/227 |
| 2009/0254697 A1 | 10/2009 | Akerib |
| 2009/0290434 A1 | 11/2009 | Kurjanowicz |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0127804 A1 | 5/2012 | Ong et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0250279 A1 | 9/2014 | Manning |
| 2014/0344934 A1 | 11/2014 | Jorgensen |
| 2015/0029798 A1 | 1/2015 | Manning |
| 2015/0042380 A1 | 2/2015 | Manning |
| 2015/0063052 A1 | 3/2015 | Manning |
| 2015/0078108 A1 | 3/2015 | Cowles et al. |
| 2015/0120987 A1 | 4/2015 | Wheeler |
| 2015/0134713 A1 | 5/2015 | Wheeler |
| 2015/0270015 A1 | 9/2015 | Murphy et al. |
| 2015/0279466 A1 | 10/2015 | Manning |
| 2015/0324290 A1 | 11/2015 | Leidel |
| 2015/0325272 A1 | 11/2015 | Murphy |
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1 | 12/2015 | Manning et al. |
| 2015/0357019 A1 | 12/2015 | Wheeler et al. |
| 2015/0357020 A1 | 12/2015 | Manning |
| 2015/0357021 A1 | 12/2015 | Hush |
| 2015/0357022 A1 | 12/2015 | Hush |
| 2015/0357023 A1 | 12/2015 | Hush |
| 2015/0357024 A1 | 12/2015 | Hush et al. |
| 2015/0357047 A1 | 12/2015 | Tiwari |
| 2016/0062672 A1 | 3/2016 | Wheeler |
| 2016/0062673 A1 | 3/2016 | Tiwari |
| 2016/0062692 A1 | 3/2016 | Finkbeiner et al. |
| 2016/0062733 A1 | 3/2016 | Tiwari |
| 2016/0063284 A1 | 3/2016 | Tiwari |
| 2016/0064045 A1 | 3/2016 | La Fratta |
| 2016/0064047 A1 | 3/2016 | Tiwari |
| 2016/0260495 A1 | 9/2016 | Paudel et al. |

(56) References Cited

U.S. PATENT DOCUMENTS

| | | |
|---|---|---|
| 2017/0263306 A1 | 9/2017 | Murphy |
| 2019/0179568 A1* | 6/2019 | Hsu ........................ G11C 16/10 |
| 2019/0196988 A1* | 6/2019 | Agarwal ............... G06F 3/0604 |

FOREIGN PATENT DOCUMENTS

| | | |
|---|---|---|
| EP | 2026209 | 2/2009 |
| GB | 2338320 | 12/1999 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 9638790 | 12/1996 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Boyd et al., "On the General Applicability of Instruction-Set Randomization", Jul.-Sep. 2010, (14 pgs.), vol. 7, Issue 3, IEEE Transactions on Dependable and Secure Computing.

Stojmenovic, "Multiplicative Circulant Networks Topological Properties and Communication Algorithms", (25 pgs.), Discrete Applied Mathematics 77 (1997) 281-305.

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

Debnath, Biplob, Bloomflash: Bloom Filter on Flash-Based Storage, 2011 31st Annual Conference on Distributed Computing Systems, Jun. 20-24, 2011, 10 pgs.

Pagiamtzis, Kostas, "Content-Addressable Memory Introduction", Jun. 25, 2007, (6 pgs.), retrieved from: http://www.pagiamtzis.com/cam/camintro.

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

International Search Report and Written Opinion for PCT Application No. PCT/US2013/043702, dated Sep. 26, 2013, (11 pgs.).

Elliot, et al., "Computational RAM: Implementing Processors in Memory", Jan.-Mar. 1999, (10 pgs.), vol. 16, Issue 1, IEEE Design and Test of Computers Magazine.

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Dibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory as a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

* cited by examiner

APPARATUS AND METHODS FOR DEBUGGING ON A HOST AND MEMORY DEVICE

PRIORITY INFORMATION

This application is a Continuation of U.S. application Ser. No. 15/077,171, filed Mar. 22, 2016, which issues as U.S. Pat. No. 10,388,393 on Aug. 20, 2019, the contents of which are incorporated herein by reference.

TECHNICAL FIELD

The present disclosure relates generally to semiconductor memory and methods, and more particularly, to apparatus and methods for debugging on a host and memory device.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Computing systems often include a number of processing resources (e.g., one or more processors), which may retrieve and execute instructions and store the results of the executed instructions to a suitable location. A processing resource can comprise a number of functional units such as arithmetic logic unit (ALU) circuitry, floating point unit (FPU) circuitry, and/or a combinatorial logic block, for example, which can be used to execute instructions by performing logical operations such as AND, OR, NOT, NAND, NOR, and XOR, and invert (e.g., inversion) logical operations on data (e.g., one or more operands). For example, functional unit circuitry may be used to perform arithmetic operations such as addition, subtraction, multiplication, and/or division on operands via a number of logical operations.

A number of components in a computing system may be involved in providing instructions to the functional unit circuitry for execution. The instructions may be executed, for instance, by a processing resource such as a controller and/or host processor. Data (e.g., the operands on which the instructions will be executed) may be stored in a memory array that is accessible by the functional unit circuitry. The instructions and/or data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the instructions and/or data may also be sequenced and/or buffered.

In many instances, the processing resources (e.g., processor and/or associated functional unit circuitry may be external to the memory array, and data is accessed via a bus between the processing resources and the memory array to execute a set of instructions. Processing performance may be improved in a processing in memory device, in which a processor may be implemented internal and/or near to a memory (e.g., directly on a same chip as the memory array). A processing in memory device may save time by reducing and/or eliminating external communications and may also conserve power.

DETAILED DESCRIPTION

Figure 1A:
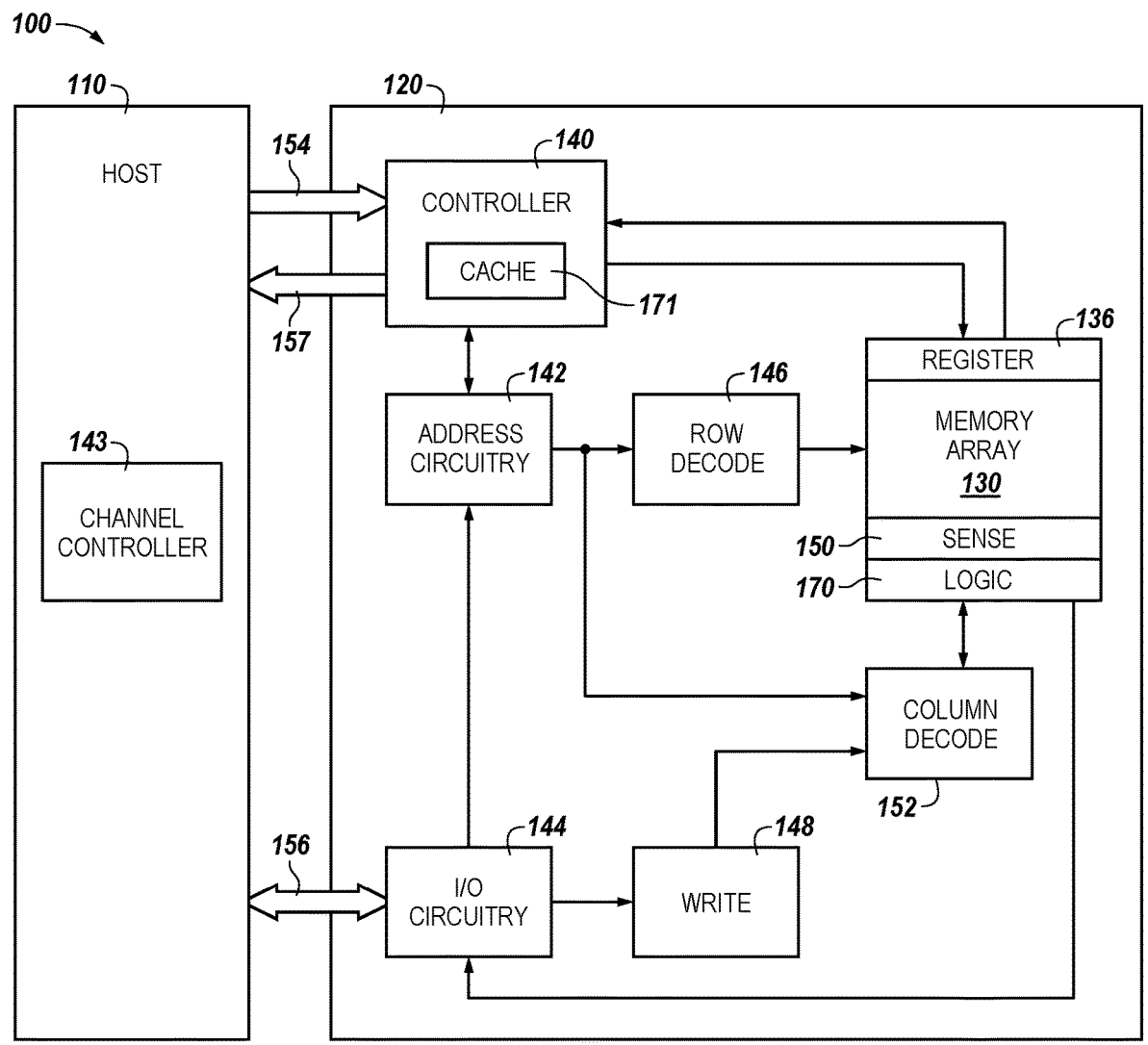
FIG. 1A is a block diagram of an apparatus in the form of an computing system including a memory device in accordance with a number of embodiments of the present disclosure.

The present disclosure includes apparatuses and methods for debugging on a host and memory device. In one embodiment, the apparatus comprises a memory device, e.g., processing in memory (PIM) device, having an array of memory cells and sensing circuitry coupled to the array. The sensing circuitry comprises a sense amplifier and a compute component and is configured to perform logical operations. A controller is coupled to the array and sensing circuitry. The controller can cause the memory device to execute instructions to perform logical operations using the sensing circuity. The apparatus further includes an interface that is configured to receive a debugging indication and to cause the controller to halt a logical operation on the memory device.

In some embodiments, the controller is configured to detect one or more debug bits stored in microcode instructions on the memory device, e.g., PIM device. The one or more debug bits may be set in microcode instructions by one or more registers after the microcode instructions have been stored to a memory array, e.g., random access memory (RAM) in the memory device. The one or more registers can be associated with the interface and may be configured to cause the one or more debug bits to be set in microcode instructions upon receipt of a debugging indication to the interface. The indication may be provided concurrently to the memory device and a host in order to correlate debugging instructions on the memory device and the host.

Typically, debugging an executable program may be performed on a host using software and/or hardware. For example, a breakpoint to halt an executing program, and run a debugging routine thereon, may be embedded in the executable program itself and/or controlled by particular hardware. A debugging software routine may then step through to test the instructions of the executable program to verify the executable program's operation, expected function and results for accuracy. When an executable program is written by a programmer it is then compiled and afterwards a debugging routine may be run on the compiled executable program while it is run on a host. Hence a host may traditionally be used to debug a program in one of two ways: one, by setting a breakpoint in software to halt and start the debugging routine; and/or second, by using more complex hardware to provide a breakpoint to halt an executing program.

Operations on certain devices may be controlled by executing microcode instructions. For example, in a processing in memory (PIM) device, microcode may be used and executed thereon by a reduced instruction set computer (RISC) type processing resource, e.g., controller. A RISC type processing resource is one example of a processing resource which operates on a reduced bit length instruction, e.g., a 32 or 64 bit length instruction. Thus, as used herein, microcode instructions are intended to include a 32 or 64 bit length instruction. Alternatively, microcode instructions may include other bit length instructions executing on a device, e.g., bit vector operation capable device, in which an instruction bit length is different than an instruction bit length being used with executable programs running on a host coupled thereto.

If a debugging routine is run on a host while microcode instructions are executing on a memory device, the host processor may not be able to halt the executing microcode instructions on the memory device. For example, software and/or hardware associated with the host may have no way of providing a breakpoint, e.g., interrupt, to halt microcode instructions on another device or even to signal to another device, e.g., a memory device, that a debugging routine is to be run on the host. Typical debugging systems on modern computers are isolated to assembly language or higher level languages using on-chip or off-chip breakpoints. Such high level debugging concepts do not apply well to debugging microcode instructions.

Therefore, according to various embodiments apparatus and methods are provided that may correlate instructions executing on a host processing resource with microcode instructions executing on another device, e.g., PIM device. In this manner, a system may concurrently debug instructions executing on a host with microcode instructions executing on another device. For example, a user (e.g., programmer, developer, etc.) may be able to perform the same debug operations, e.g., debugging routine, on a memory device executing microcode instructions as performed on the host processing resource. The debug operation may be performed concurrently for a host coupled to a memory device. In one or more embodiments, this is achieved by providing an interface to the memory device that correlates to a debugging interface used by the host processing resource.

Additionally, embodiments of the present disclosure enable a device executing, e.g., running, microcode instructions, such as a PIM capable device, to perform a debugging routine on the microcode instructions directly on the device itself, separate from using a host processing resource to conduct and coordinate a debugging routine. In one example embodiment a controller is configured to detect an indication contained within executing microcode instructions that indicates an operation being performed by the executing microcode instructions should be halted and a debugging routine executed.

The description provided herein will follow an example embodiment of microcode instructions executing on a memory device, e.g., a PIM capable device. The PIM capable device may be a bit vector operation capable memory device having an array of memory cells. In one example embodiment, the array of memory cells may be a random access memory (RAM). One example of a RAM memory includes dynamic random access memory (DRAM). Hence, examples herein may be discussed in relation to a PIM DRAM device. However, embodiments are not limited to the example use with a PIM device, PIM RAM, and/or PIM DRAM device.

As used herein, the term "bit vector" is intended to mean a physically contiguous number of bits. The physically contiguous number of bits may exist, e.g., be stored, on a bit vector operation capable memory device, e.g., PIM device, whether physically contiguous in rows (e.g., horizontally oriented) or physically contiguous in columns (e.g., vertically oriented) in an array of memory cells on the bit vector memory device. As used herein a "bit vector operation" is intended to mean an operation that is performed on a bit vector. The bit vector may be a contiguous portion (also referred to as "chunk") of virtual address space. A chunk may or may not be contiguous physically to other chunks in the virtual address space.

In one memory device example, microcode instructions to perform various operations can be received to a PIM memory device and stored in an array of memory cells on the PIM memory device. The PIM device may be a bit vector operation capable memory device. A controller on the memory device can be configured to cause the memory device to execute instructions, e.g., execute microcode instructions, to control the memory device operation. In some embodiments, a controller is provided that is configured to cause the memory device to perform a logical operation using sensing circuitry having a sense amplifier and a compute component.

According to embodiments, the controller may receive the microcode instructions from a host and store the microcode instructions for particular operations to a particular memory location on the PIM device. The microcode instructions received to the PIM device can include debugging instructions (also referred to as debugging code) for performing a debugging routine, e.g., operation, on microcode instructions. In some embodiments, the debugging instructions may be contained with the microcode instructions. The microcode instructions may similarly be stored to a particular memory location on the PIM device with other microcode instructions.

According to some embodiments, an indication to signal to the controller to halt, e.g., stop, operations and to begin to execute debugging code on microcode instructions on the memory device may be placed within the microcode instructions themselves. For example, the indication may be in the form of one or more bits contained within the microcode instructions. In one example, the one or more bits may be set by a programmer and/or a host processor and received to and stored with the microcode instructions in a memory location on the PIM device.

In additional example embodiments, an interface is provided such that a PIM device, e.g., bit vector operation capable memory device, may receive the same debugging instructions as are received to a host processing resource. In some embodiments, the interface is provided via a high speed interface (HSI) that is coupled to one or more registers, e.g., memory mapped registers, and that is coupled to an out of bound bus, a data bus and an address and control bus for the PIM device. In this example, the out of bound bus may be separate from the data bus and the address and control bus. In various embodiments, the one or more registers may control setting the one or more bits for the indication and/or the debugging instructions contained within the microcode instructions.

The one or more bits may be set to signal the indication, e.g. a breakpoint indication, and/or set to provide information for particular debugging instructions to the controller within the microcode instructions. For example, the one or more bits may be set to signal to the controller to halt microcode instructions in connection with a particular operation and/or provide particular debugging instructions. Again, the controller can be configured to control the execution of the microcode instructions for various operations on the PIM device. In this manner, the controller can be configured to receive an indication and/or debugging instructions, e.g., as set by the registers, in association with executing microcode instructions on the PIM device. The indication and/or debugging instructions may cause the controller to halt an operation associated with the microcode instructions when the controller detects the one or more bits set in a particular manner in the microcode instructions. The indication and/or debugging instructions may further cause the controller to perform a debugging routine on a particular operation in the microcode instructions on the PIM device and in a manner that is concurrent with performing a debugging routine on a host. In the PIM device example, the one or more bits may be set in association with a multiply operation, an add operation, or more specifically with an OR logical operation, etc., as defined by the microcode instructions to a PIM device, e.g., a bit vector operation capable memory device.

Hence, embodiments of the present disclosure provide apparatus and methods useful to enable debugging actual microcode operations within a memory device concurrently with debugging instructions executing separately on a host. Since microcode may exist as a series of device microcode instructions and since the microcode instructions are updateable, apparatus and methods embodiments are provided to debug a particular microcode instruction individually and/or multiple instructions concurrently.

In one example, one or more bits, e.g., "debug" bits, may be used, in the microcode itself, to designate if a certain operation will cause the controller to halt, e.g., stop, pause, etc., a particular microcode operation and may involve a user, e.g., designer, developer, programmer, etc., to step over the halt to continue the execution of the microcode operation. One or more "debug" bits can be present within one or within multiple microcode instructions. In normal microcode instruction execution, no debug bit set may be set in association with any microcode instruction operation. In the development environment, one or more debug bits can be set programmatically in advance or set in the download of the microcode sequence. Alternatively, in field use, the one or more debug bits can be set using registers, described according to embodiments herein, which are configured to cause one or more debug bits to be set in microcode instructions upon receipt of a debugging indication to an interface of a memory device, concurrent with a debugging routine sent to a host.

In one example embodiment, the one or more bits are set using the interface, e.g., HSI, and one or more registers to provide the same debug interface to a memory device as to a host. In some embodiments, the one or more registers are configured to set the one or more bits to provide the indication and/or debugging instructions contained within the microcode instructions.

The controller is configured such that if it identifies that a debug bit is set it halts the microcode instruction operation. For example, a program counter associated with the controller may stop and new microcode instructions will not be allowed to execute. In some embodiments, the one or more bits may be set using the interface and one or more registers to stop the program counter when the program counter reaches a certain value. A user, e.g., designer, developer, programmer, etc., may then have to act to manually restart/resume the microcode instruction execution sequence.

For example, a user may manually remove one or more debug bits, e.g., breakout indications (also referred to as "breakout points"), set other register values to provide indications and/or debugging instructions through the interface, e.g., HSI, insert new "debug" bits into microcode instructions using the interface and one or more registers, examine particular registers, execute a single microcode instruction at a time by enabling a "debug" bit in association with all microcode instructions, and/or examine a microcode instruction state stored on a particular PIM device. Alternatively, such actions may be contained in and/or performed by debugging code stored with the microcode instructions on the PIM device.

In some example PIM device embodiments, the apparatus and methods include an efficient method for providing a large number of microcode instructions, with arguments, to an array of memory cells on the PIM device and for routing those microcode instructions to a controller, e.g., an embedded processing engine, of the PIM device with low latency, while preserving the protocol, logical, and electrical interfaces for the array of memory cells. Hence, embodiments described herein may facilitate keeping an address and control bus at a standard width and data rate, reducing any amount of "special" design for the PIM device and also making the PIM device more compatible with existing memory interfaces in a variety of computing devices.

Additionally, the embodiments described herein may allow the host system to provide a large block of instructions, including debugging instructions, to a memory device at the beginning of an operation, significantly reducing, or completely eliminating, the interruptions in instruction execution to transfer more instructions to the memory device. Previous compromises in the memory device design and control flow for the controller to an array included significant increases in the I/O used on the memory device. The increase in the I/O used would increase the fraction of non-productive space on the memory device, increase the floor planning and noise containment complications, and increase the power dissipation on the memory device without adding additional computing performance. Other previous compromises included using relatively large, special purpose memory regions on the memory device to store instructions. Such special purpose memory regions may still not be large enough to hold the desired microcode instructions. Thus, an increase in contention for the I/O resources on the overall chip may remain and result in decreasing the effective speed of the memory device.

As described in more detail below, the embodiments can allow a host system to allocate a plurality of locations, e.g., sub-arrays (or "subarrays") or portions of subarrays in a plurality of banks to hold instructions. The host system would perform the address resolution on an entire block of microcode instructions, e.g., PIM instructions, and write them into the allocated instruction locations, e.g., subarrays, with a target bank. Writing these commands may utilizes the normal write path to the memory device. After the instructions are written into the instruction storage locations, e.g., subarrays, the host system may direct the bank controller to start execution of an instructions block. In various embodiments, the controller will retrieve microcode instructions from the allocated instruction locations as necessary to handle the branches, loops, logical and data operations contained with the blocks of microcode instructions, caching the instructions and refilling an instruction cache as necessary.

In order to appreciate the improved methods and apparatus for implementing such methods, a discussion of a memory device having PIM capabilities, and associated host, follows. According to various embodiments, microcode instructions, e.g., PIM commands, for a memory device can be received to the memory device from a host and stored to an array of memory cells on the memory device. The array may be associated with sensing circuitry that can perform logical operations by executing the microcode instructions. Thus, microcode instructions may be executed on the memory device in less time, and using less power, than would be required if executing the microcode instructions on a separate host.

Thus, improved parallelism and/or reduced power consumption in association with performing compute functions as compared to previous systems such as previous PIM systems and systems having an external processor (e.g., a processing resource located external from a memory array, such as on a separate integrated circuit chip). For example, a number of embodiments can provide for performing fully complete compute functions such as integer add, subtract, multiply, divide, and CAM (content addressable memory) functions without transferring data out of the memory array and sensing circuitry via a bus (e.g., data bus, address bus, control bus, etc.). Such compute functions can involve performing a number of logical operations (e.g., logical functions such as AND, OR, NOT, NOR, NAND, XOR, etc.). However, embodiments are not limited to these examples. For instance, performing logical operations can include performing a number of non-Boolean logic operations such as copy, compare, destroy, etc.

In previous approaches, data may be transferred from the array and sensing circuitry (e.g., via a bus comprising input/output (I/O) lines) to a processing resource such as a processor, microprocessor, and/or compute engine, which may comprise ALU circuitry and/or other functional unit circuitry configured to perform the appropriate logical operations. However, transferring data from a memory array and sensing circuitry to such processing resource(s) can involve significant power consumption. Even if the processing resource is located on a same chip as the memory array, significant power can be consumed in moving data out of the array to the compute circuitry, which can involve performing a sense line (which may be referred to herein as a digit line or data line) address access (e.g., firing of a column decode signal) in order to transfer data from sense lines onto I/O lines (e.g., local I/O lines), moving the data to the array periphery, and providing the data to the compute function.

Furthermore, the circuitry of the processing resource(s) (e.g., compute engine) may not conform to pitch rules associated with a memory array. For example, the cells of a memory array may have a $4F^2$ or $6F^2$ cell size, where "F" is a feature size corresponding to the cells. As such, the devices (e.g., logic gates) associated with ALU circuitry of previous PIM systems may not be capable of being formed on pitch with the memory cells, which can affect chip size and/or memory density, for example. A number of embodiments of the present disclosure include sensing circuitry formed on pitch with an array of memory cells and capable of performing compute functions such as gather and scatter operations local to the array of memory cells.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, designators such as "N", "M", etc., particularly with respect to reference numerals in the drawings, indicate that a number of the particular feature so designated can be included. As used herein, "a number of" a particular thing can refer to one or more of such things (e.g., a number of memory arrays can refer to one or more memory arrays). A "plurality of" is intended to refer to more than one of such things.

The figures herein follow a numbering convention in which the first digit or digits correspond to the drawing figure number and the remaining digits identify an element or component in the drawing. Similar elements or components between different figures may be identified by the use of similar digits. For example, 206 may reference element "06" in FIG. 2, and a similar element may be referenced as 606 in FIG. 6. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

Figure 1B:
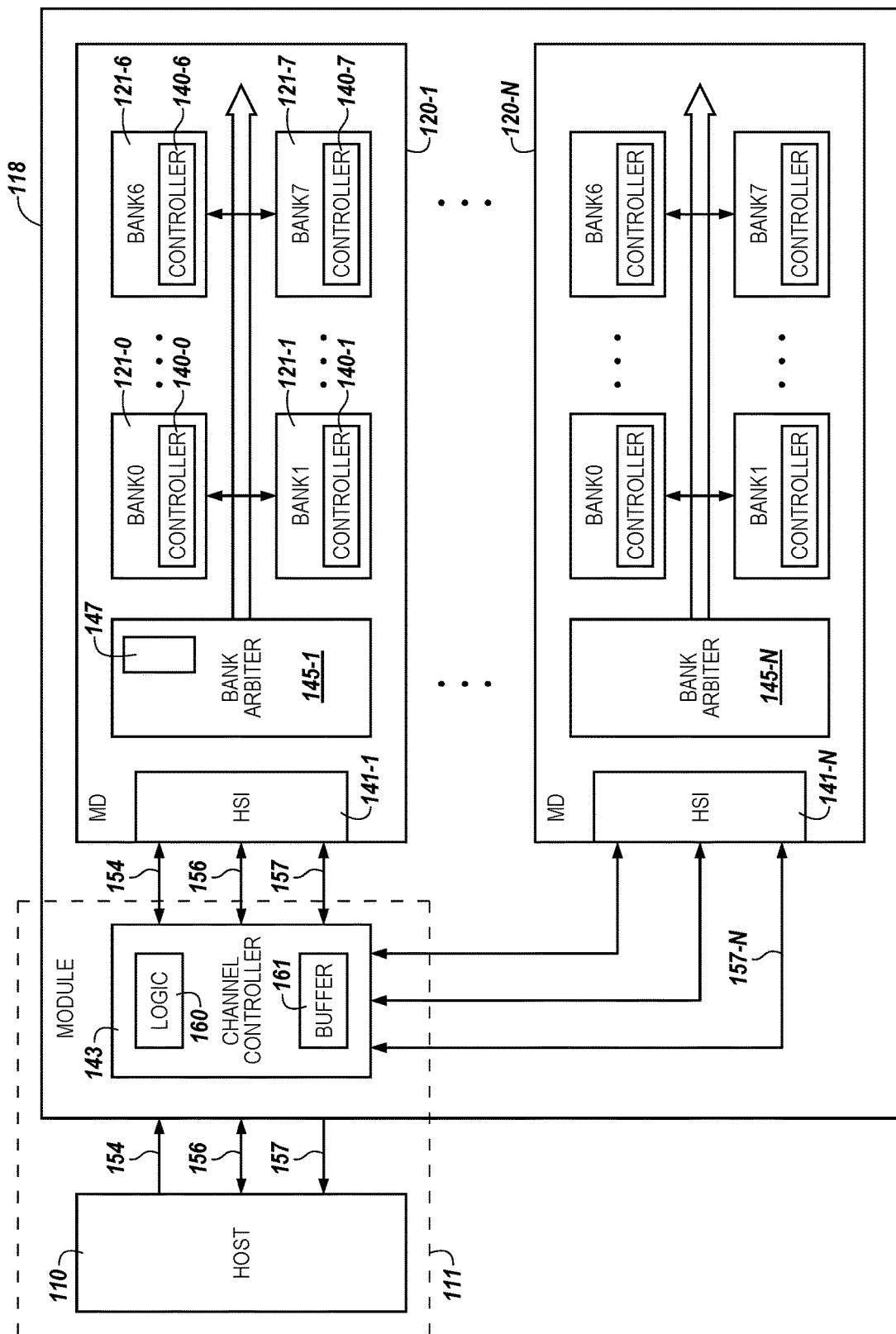
FIG. 1B is another block diagram of an apparatus in the form of an computing system including a memory device in accordance with a number of embodiments of the present disclosure.

FIGS. 1A and 1B are block diagrams of an apparatus in the form of a computing system 100 including a memory device 120 in accordance with a number of embodiments of the present disclosure. As used herein, a memory device 120, controller 140, channel controller 143, bank arbiter 145, interface 141 (e.g., high speed interface (HSI) to a memory bank 121, memory array 130, register 136, sensing circuitry 150, and/or logic circuitry 170 might also be separately considered an "apparatus."

In FIG. 1A, the example system 100 includes a host 110 coupled (e.g., connected) to memory device 120, which includes a memory array 130. Host 110 can be a host system such as a personal laptop computer, a desktop computer, a digital camera, a smart phone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIGS. 1A and 1B illustrates a system having a Von Neumann architecture, embodiments of the present disclosure can be implemented in non-Von Neumann architectures, which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines, which may be referred to herein as data lines or digit lines. Although a single array 130 is shown in FIG. 1, embodiments are not so limited. For instance, memory device 120 may include a number of arrays 130 (e.g., a number of banks of DRAM cells, NAND flash cells, etc.).

The memory device 120 includes address circuitry 142 to latch address signals for data provided over a data bus 156 (e.g., an I/O bus) through I/O circuitry 144. Status and/or exception information can be provided from the memory controller 140 on the memory device 120 to a channel controller 143, including an out-of-band bus 157 (shown in FIG. 1B), which in turn can be provided from the memory device 120 to the host 110. Address signals are received through address circuitry 142 and decoded by a row decoder 146 and a column decoder 152 to access the memory array 130. Data can be read from memory array 130 by sensing voltage and/or current changes on the data lines using sensing circuitry 150. The sensing circuitry 150 can read and latch a page (e.g., row) of data from the memory array 130. The I/O circuitry 144 can be used for bi-directional data communication with host 110 over the data bus 156. The write circuitry 148 is used to write data to the memory array 130.

Registers 136 may include one or more separate registers, e.g., separate and/or in addition to other array control registers such as double data rate (DDR) registers to a DRAM array. The registers 136 may be coupled to an interface (e.g., 141 in FIG. 1B) of the memory device 120 to a host 110. The registers 136 may also be used to control the operation of an array 130 of the memory device 120, e.g., a DRAM array, and/or the controller 140. As such, the registers 136 may be coupled to the I/O circuitry 144 and/or controller 140. In various embodiments the registers 136 may be memory mapped I/O registers 136. The memory mapped I/O registers 136 can be mapped to a plurality of locations in memory where microcode instructions are stored. The memory mapped I/O registers 136 may thus be configured to set one or more debug bits in microcode instructions stored to the plurality of locations. In some embodiments, the registers 136 may include a block of static random access memory (SRAM) cells. Registers 136 may be coupled to DDR registers to further control the operation of a dynamic random access memory (DRAM) array. Embodiments are not limited to the examples given herein.

Controller 140 may decode signals provided by control bus 154 from the host 110. According to various embodiments, the controller 140 can be a reduced instruction set computer (RISC) type controller operating on 32 and/or 64 bit length instructions. These signals can include chip enable signals, write enable signals, and address latch signals that are used to control operations performed on the memory array 130, including data read, data write, and data erase operations. In various embodiments, the controller 140 is responsible for executing instructions from the host 110. The controller 140 can include firmware in the form of executable microcode instructions and/or hardware in the form of an application specific integrated circuit (ASIC) and transistor circuitry. In various embodiments the controller 140 can control shifting data (e.g., right or left) in an array 130.

Examples of the sensing circuitry 150 are described further below. For instance, in a number of embodiments, the sensing circuitry 150 can comprise a sense amplifier and a compute component, which may serve as, and be referred to herein as, an accumulator and can be used to perform logical operations (e.g., on data associated with complementary data lines).

In a number of embodiments, the sensing circuitry 150 can be used to perform logical operations using data stored in array 130 as inputs and store the results of the logical operations back to the array 130 without transferring data via a sense line address access (e.g., without firing a column decode signal). As such, various compute functions can be performed using, and within, sensing circuitry 150 rather than (or in association with) being performed by processing resources external to the sensing circuitry (e.g., by a processor associated with host 110 and/or other processing circuitry, such as ALU circuitry, located on device 120 (e.g., on controller 140 or elsewhere)).

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform compute functions using the operands, and the result would be transferred back to the array via the I/O lines. In contrast, in a number of embodiments of the present disclosure, sensing circuitry 150 is configured to perform logical operations on data stored in memory array 130 and store the result back to the memory array 130 without enabling an I/O line (e.g., a local I/O line) coupled to the sensing circuitry 150. The sensing circuitry 150 can be formed on pitch with the memory cells of the array 130. As used herein, the term "on pitch" is intended to mean the sensing circuitry is formed according to a same design rule, photolithographic and/or other semiconductor fabrication process as the array 130. Additional peripheral sense amplifiers, registers, cache and/or data buffering, e.g., logic circuitry 170, can be coupled to the sensing circuitry 150 and can be used to store, e.g., cache and/or buffer, results of operations described herein.

As such, in a number of embodiments, circuitry external to array 130 and sensing circuitry 150 is not needed to perform compute functions as the sensing circuitry 150 can perform the appropriate logical operations to perform such compute functions without the use of an external processing resource. Therefore, the sensing circuitry 150 may be used to compliment and/or to replace, at least to some extent, such an external processing resource (or at least the bandwidth consumption of such an external processing resource).

However, in a number of embodiments, the sensing circuitry 150 may be used to perform logical operations (e.g., to execute instructions) in addition to logical operations performed by an external processing resource (e.g., host 110). For instance, host 110 and/or sensing circuitry 150 may be limited to performing only certain logical operations and/or a certain number of logical operations.

Enabling an I/O line can include enabling (e.g., turning on) a transistor having a gate coupled to a decode signal (e.g., a column decode signal) and a source/drain coupled to the I/O line. However, embodiments are not limited to not enabling an I/O line. For instance, in a number of embodiments, the sensing circuitry (e.g., 150) can be used to perform logical operations without enabling column decode lines of the array; however, the local I/O line(s) may be enabled in order to transfer a result to a suitable location other than back to the array 130 (e.g., to an external register).

FIG. 1B is a block diagram of another apparatus architecture in the form of a computing system 100 including a plurality of memory devices 120-1, ..., 120-N coupled to a host 110 via a channel controller 143 in accordance with a number of embodiments of the present disclosure. In at least one embodiment the channel controller 143 may be coupled to the plurality of memory devices 120-1, ..., 120-N in an integrated manner in the form of a module 118, e.g., formed on same chip with the plurality of memory devices 120-1, ..., 120-N. In an alternative embodiment, the channel controller 143 may be integrated with the host 110, as illustrated by dashed lines 111, e.g., formed on a separate chip from the plurality of memory devices 120-1, ..., 120-N. The channel controller 143 can be coupled to each of the plurality of memory devices 120-1, ..., 120-N via an address and control (A/C) bus 154 as described in FIG. 1A which in turn can be coupled to the host 110.

The channel controller 143 can also be coupled to each of the plurality of memory devices, 120-1, ..., 120-N via a data bus 156 as described in FIG. 1A which in turn can be coupled to the host 110. In addition, the channel controller 143 can be coupled to each of the plurality of memory devices 120-1, ..., 120-N via an out-of-bound (OOB) bus 157 associated with an interface 141 (e.g., high speed interface (HSI). As used herein, the term channel controller is intended to mean logic in the form of firmware (e.g., microcode instructions) and/or hardware (e.g., an application specific integrated circuit (ASIC)) to implement one or more particular functions. One example of a channel controller may include a state machine. Another example may include an embedded processing resource. The channel controller 143 includes logic to handle input/output (I/O) tasks to a device.

As shown in FIG. 1B, the channel controller 143 can receive the status and exception information from an interface 141 (e.g., HSI, also referred to herein as a status channel interface) associated with a bank arbiter 145 in each of the plurality of memory devices 120-1, ..., 120-N. In various embodiments the interface 141 is configured to receive a debugging indication for one or move of the plurality of memory devices 120-1, ..., 120-N from a host 110. In other embodiments, the interface 141 is configured to receive a debugging indication for one or more of the plurality of memory devices 120-1, ..., 120-N from another debugging tool, e.g. third party debugging tool. The other debugging tool may be in the form of separate hardware, software, firmware or some combination thereof. In some embodiments the debugging indication may be received to a dedicated pin on the interface 141 associated with an out of bound (OOB) bus 157. In the example embodiment of FIG. 1B, the debugging indication may be received to the interface 141 from the host 110 via the channel controller 143.

In the example of FIG. 1B, each of the plurality of memory devices 120-1, ..., 120-N can include a bank arbiter 145 to sequence control and data with a plurality of banks, e.g., Bank zero (0), Bank one (1), ..., Bank six (6), Bank seven (7), etc. Each of the plurality of banks, Bank 0, ..., Bank 7, can include a controller 140 and other components, including an array of memory cells 130 and sensing circuitry 150, logic circuitry 170, etc., as described in connection with FIG. 1A.

For example, each of the plurality of banks, e.g., Bank 0, ..., Bank 7, in the plurality of memory devices 120-1, ..., 120-N can include address circuitry 142 to latch address signals provided over a data bus 156 (e.g., an I/O bus) through I/O circuitry 144. Status and/or exception information can be provided from the controller 140 on the memory device 120 to the channel controller 143, using the OOB bus 157, which in turn can be provided from the plurality of memory devices 120-1, ..., 120-N to the host 110 and vice versa. For example, in some example embodiments a debugging indication may be received as an exception to a controller 140 on the memory device from a host 110 via the channel controller 143 using the OOB bus 157.

For each of the plurality of banks, e.g., Bank 0, ..., Bank 7, address signals can be received through address circuitry 142 and decoded by a row decoder 146 and a column decoder 152 to access the memory array 130. Data can be read from memory array 130 by sensing voltage and/or current changes on the data lines using sensing circuitry 150. The sensing circuitry 150 can read and latch a page (e.g., row) of data from the memory array 130. Each of the plurality of banks can further include registers 136 as shown in FIG. 1A configured to receive a debugging indication from a host 110. The I/O circuitry 144 can be used for bi-directional data communication with host 110 over the data bus 156. The write circuitry 148 is used to write data to the memory array 130 and the OOB bus 157 can be used to report status, exception and other data information to the channel controller 143.

The channel controller 143 can include one or more local buffers 161 to store an microcode instructions and can include logic 160 to allocate a plurality of locations, e.g., subarrays or portions of subarrays, in the arrays of each respective bank to store microcode instructions, e.g., bank commands and arguments, PIM commands, debugging instructions, etc., for the various banks associated with the operation of each of the plurality of memory devices 120-1, ..., 120-N. The channel controller 143 can send microcode instructions, e.g., bank commands and arguments, PIM commands, status and exception information, debugging indications and/or debugging instructions, etc., to the plurality of memory devices 120-1, ..., 120-N to store those microcode instructions within a given bank of a memory device. For example, the channel controller 143 and/or bank arbiter 145 may send one or more debugging indications and/or debugging instructions to registers 136 associated with arrays 130 of the plurality of banks 121-1, ..., 121-7.

As described above in connection with FIG. 1A, the memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines, which may be referred to herein as data lines or digit lines.

As in FIG. 1A, a controller 140 associated with a particular bank, Bank 0, ..., Bank 7, in a given memory device, 120-1, ..., 120-N, may decode signals provided by control bus 154 from the host 110. These signals can include chip enable signals, write enable signals, debugging indication signals as described herein, and address latch signals that are used to control operations performed on the memory array 130, including data read, data write, and data erase operations. In various embodiments, the controller 140 is responsible for executing instructions from the host 110. And, as above, the controller 140 can be in the form of firmware and/or hardware.

Figure 1C:
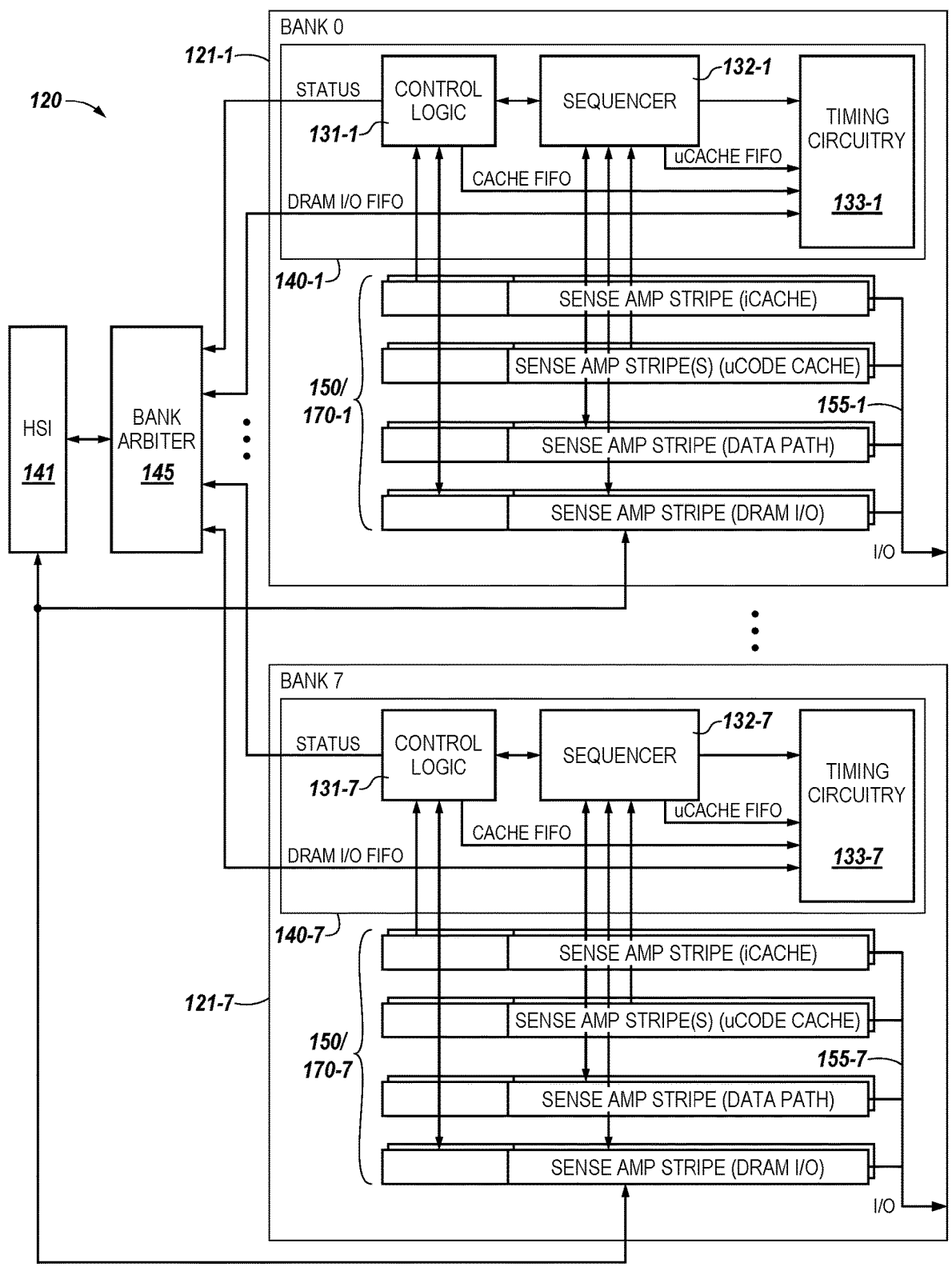
FIG. 1C is a block diagram of a memory device in accordance with a number of embodiments of the present disclosure.

FIG. 1C is a block diagram of at least a portion of a memory device in accordance with a number of embodiments of the present disclosure. The memory device shown in FIG. 1C may represent different detail to the memory device 120 shown in FIGS. 1A and 1B. As shown in FIG. 1C, an interface 141 (e.g., HSI) may be coupled to a bank arbiter 145 for the memory device 120. In various embodiments the interface 141 may be configured to receive a debugging indication from a host 110 and/or from another debugging tool, whether in the form of hardware, software, firmware or some combination thereof. In some embodiments the debugging indication may be received to one or more dedicated pins on the interface 141.

In the example embodiment of FIG. 1C, the debugging indication may be received to the interface 141 from the host 110 and/or from another debugging tool via a channel controller 143. The interface 141 may be coupled to a channel controller 143 via an address and control bus 154, data bus 156, and an out of band (OOB) bus 157 as described in FIGS. 1A and 1B. The bank arbiter 145 may be coupled to a plurality of banks 121-1, . . . , 121-7 (Bank 0-Bank 7) including arrays 130 and registers 136 as shown in FIGS. 1A and 1B.

In some embodiments, each bank in the plurality of banks 121-1, . . . , 121-7 (Bank 0-Bank 7) may be configured with a controller 140-1, . . . , 140-7. The controllers 140-1, . . . , 140-7 may represent the controllers shown in FIGS. 1A and 1B. According to the example embodiment shown in FIG. 1C, each controller 140-1, . . . , 140-7 may comprise a control logic 131-1, . . . , 131-7, a sequencer 132-1, . . . , 132-7, and timing circuitry (e.g., an atomic state machine (Atto)) 133-1, . . . , 133-7. In some embodiments the control logic 131-1, . . . , 131-7 may be responsible for fetching microcode instructions (e.g., extended protocol instruction set architecture (EPISA) machine instructions), from an array of memory cells, e.g., a DRAM array, in one or more banks of the plurality of banks 121-1, . . . , 121-7 (Bank 0-Bank 7). The control logic 131-1, . . . , 131-7 may decode the microcode instructions into function calls, e.g., microcode function calls (uCODE), implemented by the sequencers 132-1, . . . , 132-7.

The microcode function calls can be the operations that the sequencers 132-1, . . . , 132-7 receive and operate on to cause the memory device to perform particular logical operations. For example, the function calls may be received and operated on by the sequencers 132-1, . . . , 132-7 to cause the sensing circuitry 150 shown in FIG. 1A to perform a logical operation, e.g., addition, multiplication, or, as a more specific example, a Boolean such as an OR and/or XOR operation, etc. The logical operations may additionally comprise DRAM operations such as a read, write, copy, and/or erase operations, etc. The controllers 140-1, . . . , 140-7 may be coupled to sensing circuitry 150 and/or logic 170, including cache, buffers, sense amplifiers and/or registers, associated with arrays of memory cells via control lines and data paths 149/151, described more in connection with FIG. 1D. The sensing circuitry 150 and logic 170 can further be associated to the arrays of memory cells via data I/Os shown as 155-1, . . . , 155-7.

In some embodiments the sequencers 132-1, . . . , 132-7 may generate sequences of operation cycles for a DRAM array. For example, each sequence may be designed to perform operations, such as a Boolean logic operation (AND, OR, XOR, etc.), which together achieve a specific function, such as repetitively calculating the logic equations for a one (1) bit add in order to calculate a multiple bit sum. Each of these operations may be fed into a first in/first out (FIFO) buffer provided by the timing circuitry 133-1, . . . , 133-7 for execution using the sensing circuity 150 and/or logic 170 associated with the array of memory cells, e.g., DRAM arrays.

In the example embodiment shown in FIG. 1C the timing circuitry 133-1, . . . , 133-7, may provide timing and be responsible providing conflict free access to the arrays from four (4) FIFO queues. One FIFO queue may support array computation, one may be for Instruction fetch, one for microcode (e.g., Ucode) instruction fetch, and one for DRAM I/O. In various embodiments both the control logic 131-1, . . . , 131-7 and the sequencers 132-1, . . . , 132-7 can generate status information, which is routed back to the bank arbiter 145 via a FIFO interface. The bank arbiter 145 may aggregate this status data and report it back to a channel controller, such as 143 shown in FIG. 1B, via the interface 141.

Figure 1D:
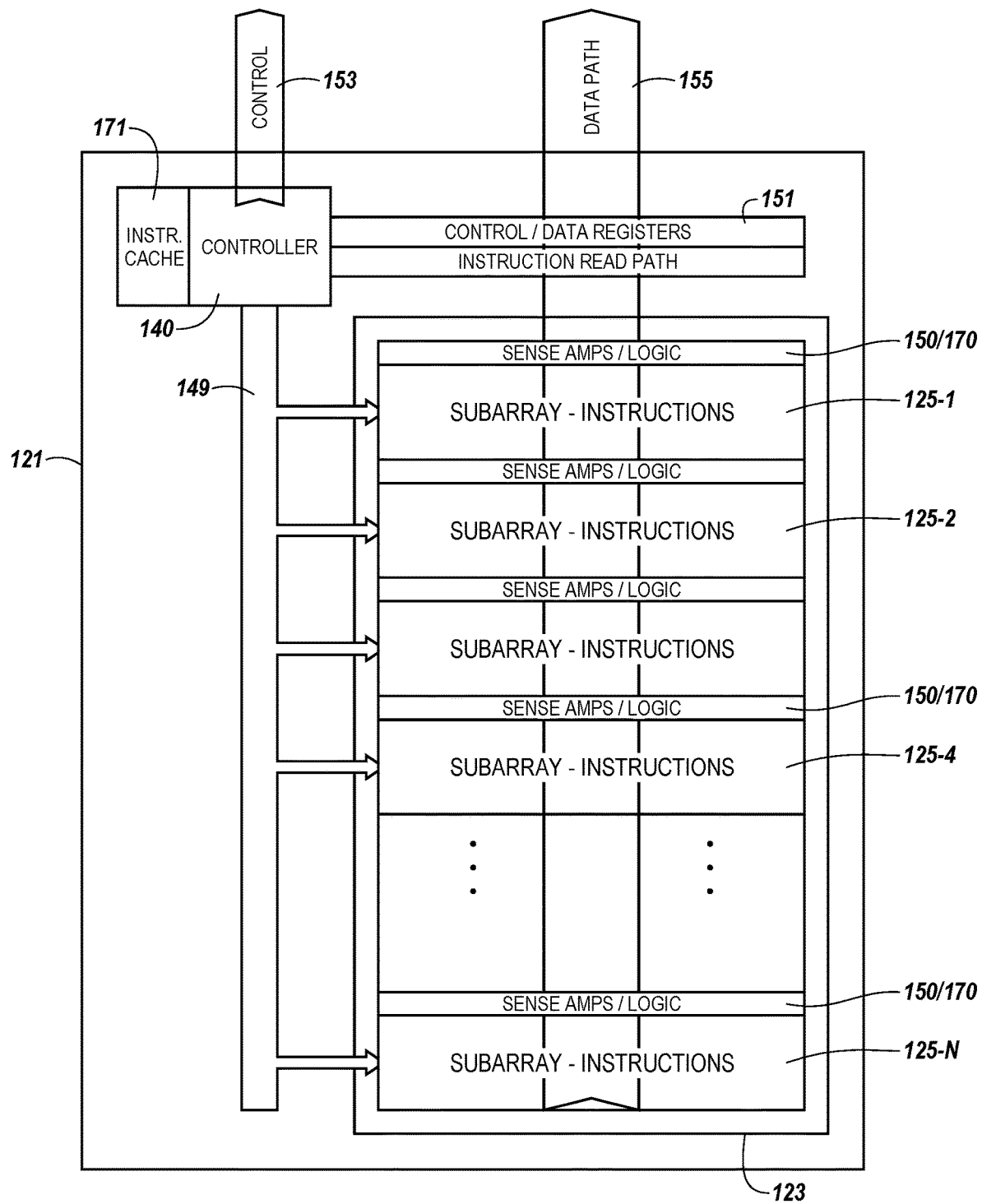
FIG. 1D is a block diagram of a bank to a memory device in accordance with a number of embodiments of the present disclosure.

FIG. 1D is a block diagram of a bank 121 to a memory device in accordance with a number of embodiments of the present disclosure. For example, bank 121 can represent an example bank to a memory device such one of the plurality of banks, Bank 0, . . . , Bank 7 (121-0, . . . , 121-7), shown in FIG. 1B. As shown in FIG. 1D, a bank architecture can include an additional address and control path 153 coupled the controller 140. The controller 140 shown in FIG. 1D can, for example, include at least a portion of the functionality described in connection with the controller 140 shown in FIGS. 1A, 1B and 1C. Also, as shown in FIG. 1D, a bank architecture can include an additional data path 155 coupled to a plurality of control/data registers 151 in an instruction (e.g., microcode instructions) and read path. The data path 155 may additionally be coupled to a plurality of bank sections, e.g., bank section 123, in a particular bank 121.

As shown in the example embodiment of FIG. 1D, a bank section 123 can be further subdivided into a plurality of subarrays 125-1, 125-2, . . . , 125-N and separated by of plurality of sensing circuitry and logic 150/170. An example embodiment, of such sensing circuitry 150 is described further in connection with FIGS. 2-4. In one example, a bank section 123 may be divided into sixteen (16) subarrays. However, embodiments are not limited to this example number.

FIG. 1D, illustrates an instruction cache 171 associated with the controller 140 and coupled to a write path 149 and coupled to each of the subarrays 125-1, . . . , 125-N in the bank section 123. Alternatively or additionally, logic circuitry 170 shown in FIG. 1A may be used as an instruction cache, e.g., used to cache and/or re-cache retrieved microcode instructions local (e.g., on-pitch) to a particular bank. In at least one embodiment, the plurality of subarrays 125-1, . . . , 125-N, and/or portions of the plurality of subarrays, may be referred to as a plurality of locations for storing microcode instructions, e.g., PIM commands, and/or constant data to an array 130, bank 121 and/or bank section 123 of a memory device 120.

According to embodiments of the present disclosure, the controller 140 shown in FIG. 1D, is configured to receive a block of instructions and/or constant data from a host, e.g., host 110 in FIG. 1A. Alternatively, the block of instructions and/or constant data may be received to the controller 140 from a channel controller 143 either integrated with the host 110 or separate from the host, e.g., integrated in the form of a module 118 with one or more of a plurality of memory devices, 120-1, . . . , 120-N, as shown in FIG. 1B.

The block of instructions and/or data can include a set of microcode instructions, e.g. PIM commands, and/or constant data, e.g., data to set up for PIM calculations. According to embodiments, the controller 140 is configured to store the block of instructions and/or constant data from the host 110 and/or channel controller 143 in a memory device 120, e.g., in array 130 shown in FIG. 1A, bank 121, bank section 123 and/or subarrays 125 shown in FIG. 1D. The controller 140 is further configured to receive and execute microcode instructions to perform logical operation using the sensing circuitry having a compute component, such as sensing circuitry shown as 150 in FIG. 1A and compute components 231 and 331 described in connection with FIGS. 2 and 3.

In at least one embodiment the controller 140 is configured to use memory device protocol and memory device logical and electrical interfaces to receive and execute the microcode instructions and/or operate on constant data to perform logical operations using the sensing circuitry 150, 250 and/or 350. For example, in some embodiments the controller 140 may be configured to use a DRAM protocol and DRAM logical and electrical interfaces to receive and execute the microcode instructions, detect a debugging indication therein and execute debugging instructions to perform a debugging routine on the microcode instructions in association with a particular operation. Embodiments, however, are not limited to this example. In some embodiments, the microcode instructions and/or constant data received to the controller 140 can be pre-resolved, e.g., pre-defined, by a programmer and/or provided to the host 110 and/or channel controller 143. In alternative embodiments, the microcode instructions may be operated upon by registers 136, based on a debugging indication received to an interface 141 of the memory device 120, to concurrently perform a debugging operation on microcode instructions on the memory device 120 with a debugging routine being executed on a separate host 110.

In some embodiments, a bank arbiter 145 is configured to receive an instruction block of microcode instructions and/or constant data relevant to a particular bank from among the plurality of banks 121-1, . . . , 121-7 and the bank arbiter is configured to send the microcode instructions and/or constant data to the particular bank. The controller 140 can then store microcode instructions in the received instruction block and/or constant data to a plurality of locations for the particular bank as allocated by the host 110 and/or channel controller 143. For example, the host 110 and/or channel controller 143 may be configured to address translate the plurality of locations for the bank arbiter 145 to assign to banks of the memory device 120. In at least one embodiment, as shown in FIG. 1D, the plurality of locations includes a number of subarrays 125-1, . . . , 125-N in the banks 121-1, . . . , 121-7, e.g., DRAM banks, and/or portions of the number of subarrays.

Further, according to some embodiments, the controller 140 is configured such that a bank 121 can receive a subsequent instruction block of microcode instructions relevant to the particular bank and store instructions in the received instruction block to a plurality of locations for the particular bank while, e.g., in parallel, the memory controller 140 is executing a previously received instruction block. Hence, the embodiments described herein avoid needing to wait for future, or a next set of microcode instructions, e.g., PIM commands, to be received from a host 110 and/or channel controller 143.

Figure 2:
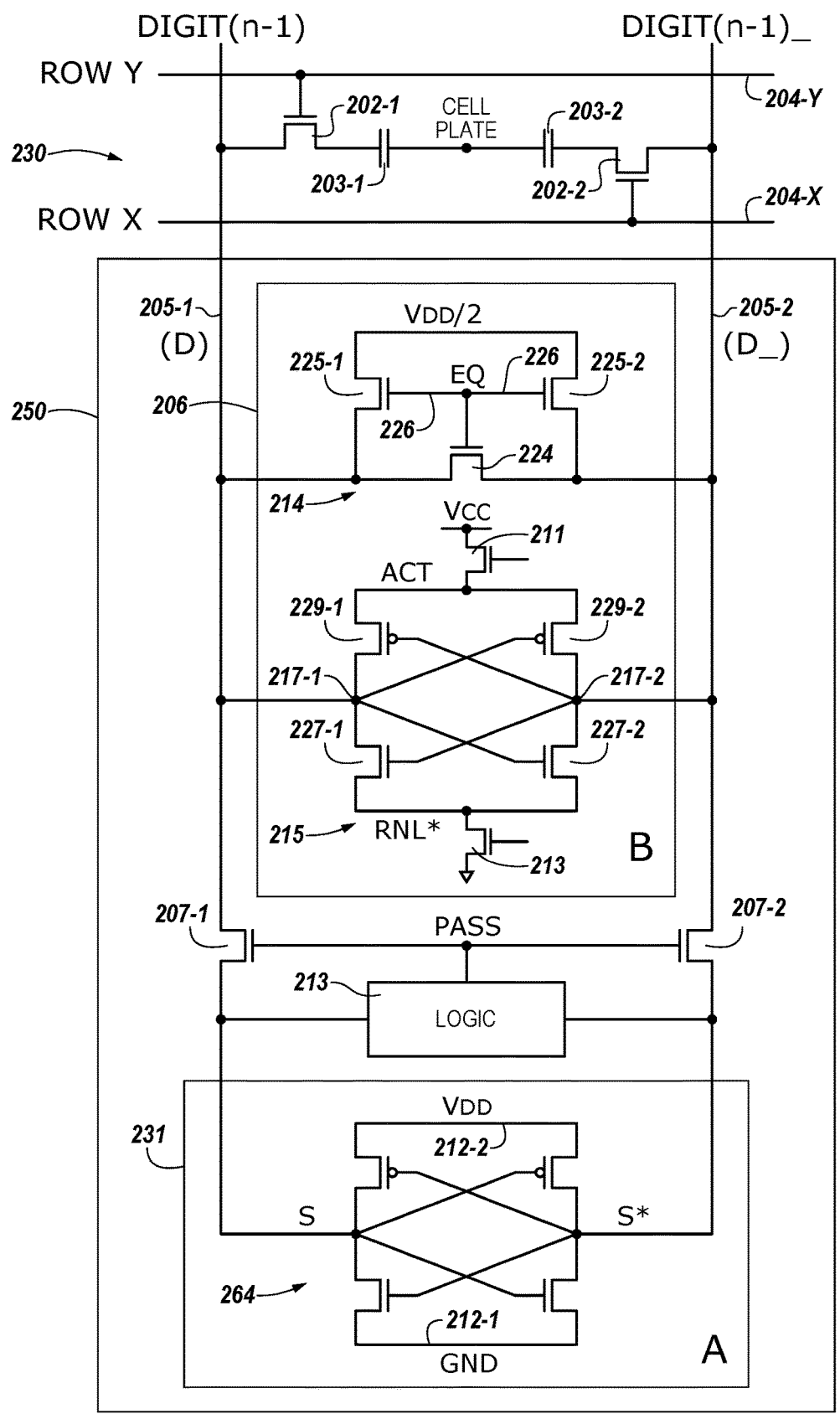
FIG. 2 is a schematic diagram illustrating sensing circuitry to a memory device in accordance with a number of embodiments of the present disclosure.
Figure 3:
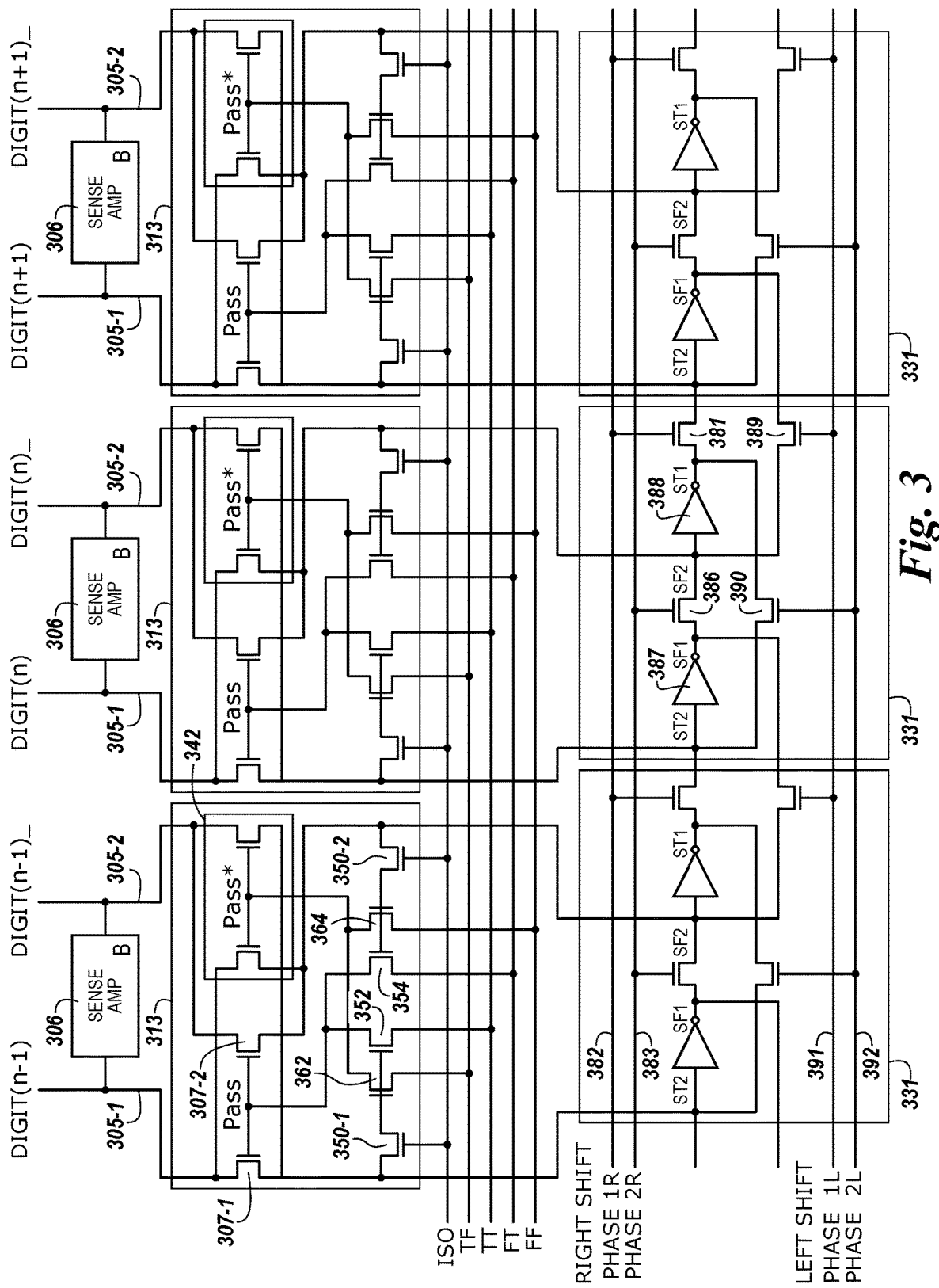
FIG. 3 is a schematic diagram illustrating sensing circuitry to a memory device in accordance with a number of embodiments of the present disclosure.
Figure 4:
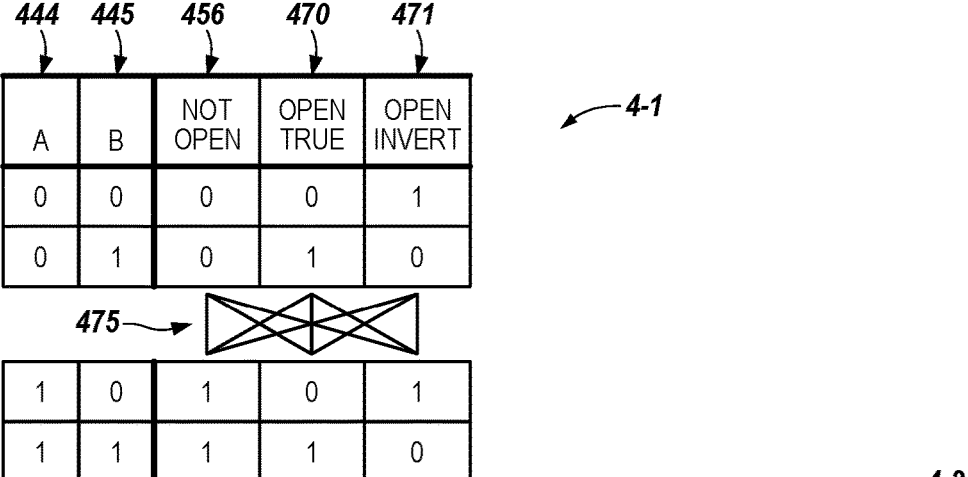
FIG. 4 is a logic table illustrating selectable logic operation results implemented by a sensing circuitry shown in FIG. 3 in accordance with a number of embodiments of the present disclosure.

As the reader will appreciate, and as described in more detail in the examples of FIGS. 2-4, a controller 140 may be configured to control the execution of microcode instructions, e.g., PIM commands and/or debugging instructions, by controlling the sensing circuitry 150, including compute components 231 and/or 331 shown in FIGS. 2 and 3, to perform and/or debug logical functions such as AND, OR, NOT, NAND, NOR, and XOR logical functions concurrent with debugging instructions executing separately on a host. In addition, the controller 140 may be configured to control the sensing circuitry 150 to perform non-Boolean logic operations, including copy, compare and erase operations, as part of executing microcode instructions, e.g., PIM commands.

Figure 1E:
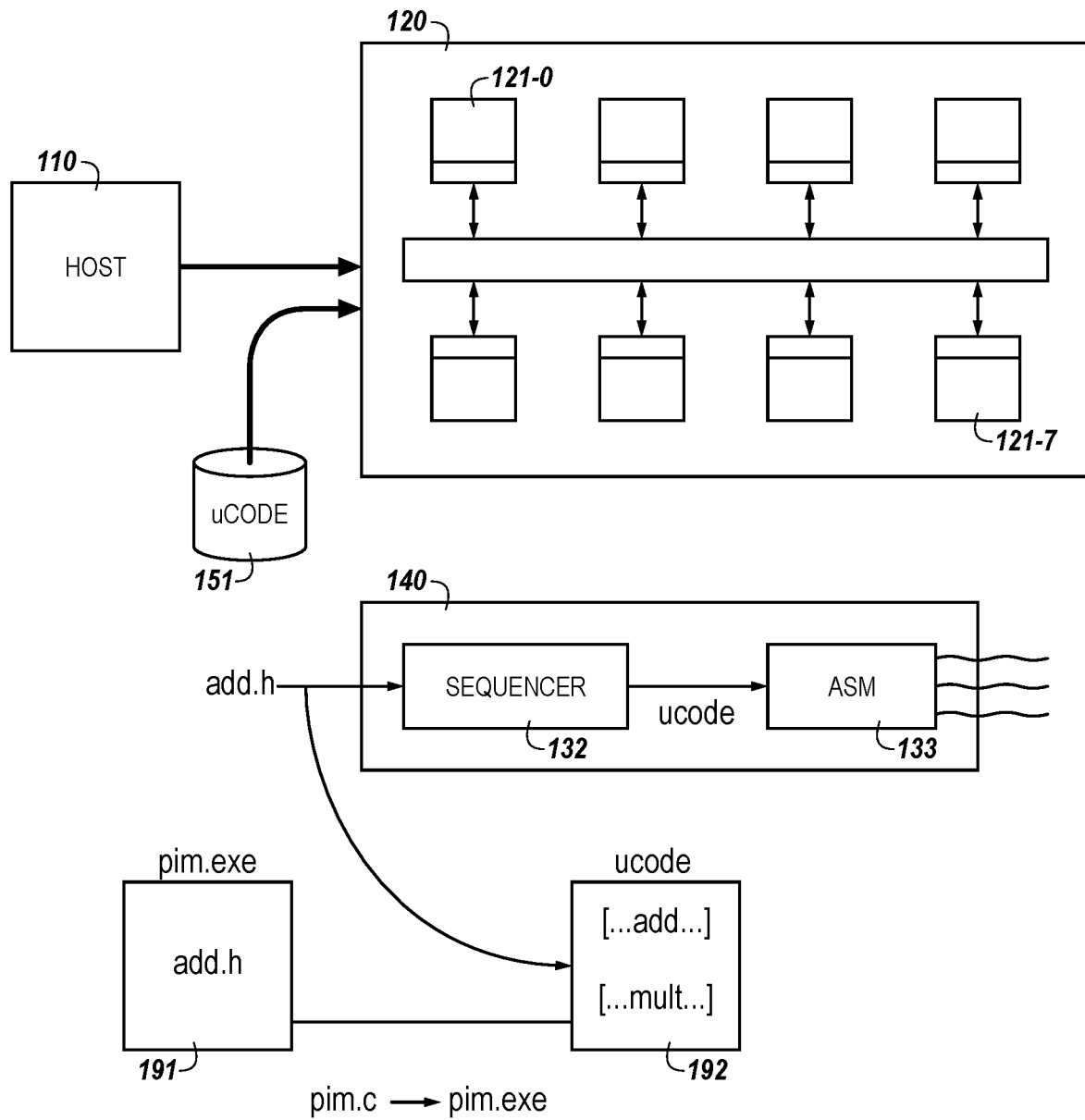
FIG. 1E illustrates microcode instructions may be compiled and retrieved to load to a plurality of locations in the memory device and may be operated upon by a controller to perform debugging on the memory device in accordance with a number of embodiments of the present disclosure.
Figure 1F:
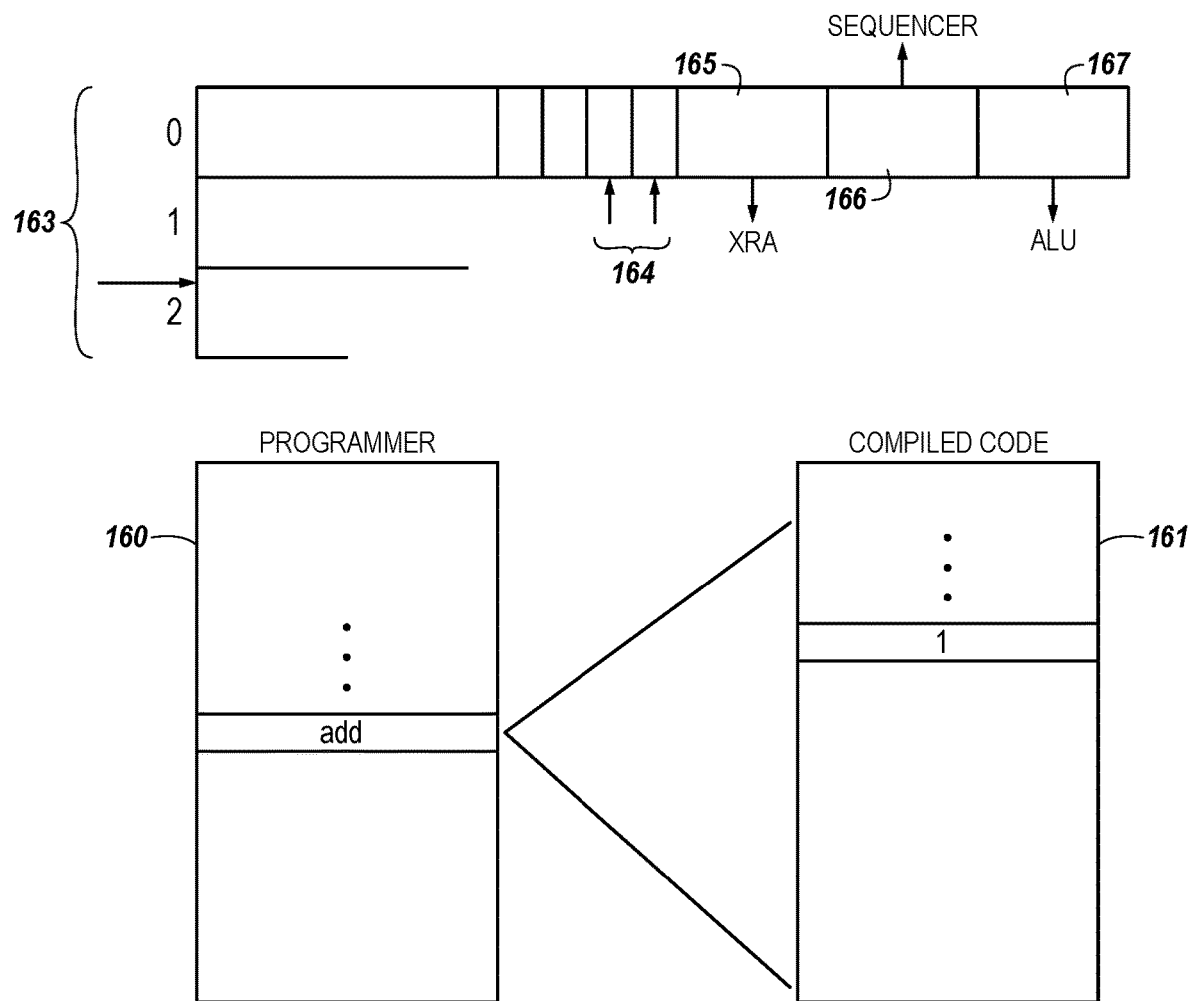
FIG. 1F illustrates one or more microcode instructions including an indication to a controller to halt an operation in association with a microcode instruction and conduct a debugging routine.

According to embodiments, the controller 140 is configured to perform debugging operations directly on the memory device 120 in response to a debugging indication. One or more debug bits may be contained in microcode instructions received as a file and stored to an array of the memory device 120 and/or set by registers 136 in response to the debugging indication. FIGS. 1E and 1F are diagrams illustrating example embodiments of the manner in which instructions for a computing system may be compiled and stored to disk or database and retrieved to load to a plurality of locations, e.g., banks 121-1, . . . , 121-7, on a processing in memory (PIM) device 120 for debugging on the PIM device 120.

As described according to embodiments herein, the one or more debug bits can be set in microcode instructions as controlled by registers 136 after the microcode instructions have been stored to an array of the memory device 120. Such registers 136 may be configured to retrieve microcode instructions from the array and to cause one or more debug bits to be set the microcode instructions in response to one or more debugging indications. The debugging indications may be received via the interface 141. According to embodiments, the one or more indications may be provided concurrently to the memory device 120 and a separate host 110 in order to correlate debugging instructions on the memory device 120 and the host 110.

FIG. 1E is a diagram illustrating microcode instructions 191, e.g., PIM instructions, may be written in a programming language, e.g., by a programmer, and that PIM code (pim.c) may be compiled into a PIM executable file (pim.exe) by a compiler or other programming tool. The PIM executable (pim.exe) may include instructions to perform a horizontal add operation (add.h), for example. The PIM executable (pim.exe) may be stored in a file or database 151 as microcode instructions. The microcode instructions may have microcode for many intended memory device operations such as addition, multiplication, and/or more specific Boolean operations such as an OR logical operation, as reflected in the microcode 192.

According to various embodiments, a programmer may place an indication, e.g., breakpoint, in the microcode anywhere it is desired that an operation be halted and a debugging operation run on the microcode operation. For example, the programmer may set one or more particular bits in the microcode to signal to a controller to halt a particular operation on PIM device and to commence performing a debugging routine on the so indicated operation.

According some embodiments, the one or more bits are set in microcode instructions as controlled by registers 136 after the microcode instructions has been stored to an array of the memory device 120. The one or more bits can be set to break on particular microcode instructions, such as to break when a horizontal add instruction operation is received to the controller 140, or alternatively when a multiplication operation and/or OR operation is received, etc.

As shown in the example embodiment of FIG. 1E, the microcode instruction for an operation, such as a horizontal add operation (add.h), may be retrieved from a particular location where it has been stored, e.g., banks 121-1, ..., 121-7, bank sections, subarrays, etc., in the memory device 120 and provided to a controller 140 associated with the particular bank. In this example, a sequencer 132 may detect one or more bits set as a flag and/or indication, e.g., as a breakpoint indication, to the controller 140 to cause the controller 140 to halt, e.g., stop or pause, execution of the operation and to commence a debugging routine on the microcode instructions within the memory device 120.

In one example embodiment, the control logic 131 and sequencer 132 (described in connection with FIG. 1C) may detect a "debug" bit set in the microcode instructions and may cause timing circuity 133 (described in connection with FIG. 1C) to begin a debugging routine on the microcode instructions. It is noted that according to embodiments, the memory device 120 may allow for normal operations, read, write, etc., to continue to function with the memory device, e.g., continue to read and/or write to the array on the memory device. For example, the read and/or write operations can be used with the debugging routine being conducted on the microcode instructions on the memory device. In this example, the timing circuitry 133 can be responsible for timing the debugging routine and can be responsible for providing conflict free access to the arrays of memory cells in the memory device 120 in association with conducting a debugging routine.

FIG. 1F illustrates that one or more microcode instructions 163 may be composed of a plurality of bit fields 164, 165, 166 and 167. For example, a microcode instruction may be 64 bit word with several spare or unused bit fields available to be used as debug bits, according to embodiments described herein. In the example of FIG. 1F, the unused bit fields 164 can then be used by a programmer to set an indication directly within the a particular microcode instruction that an operation should break upon receipt of the instruction by a controller and that a debugging routine is to be commenced. As shown, other bit fields in the microcode instructions will serve other microcode instructions purposes such logic bit fields 165, e.g., extended row address (XRA) bit fields, sequencer instruction bit fields 166, arithmetic logic unit (ALU) bit fields 167, etc.

Hence, as a programmer writes microcode instructions 160 for a memory device, the programmer will code particular operations, e.g., an addition (add) operation, and may insert a breakpoint indication directly into the microcode instructions 160. As those microcode instructions are compiled 161 the breakpoint indication may be converted to one or more set, "debug" bits in the microcode instructions which then are present in the microcode instructions 163 themselves.

Alternatively, the unused bit fields 164 may represent one or more debug bits that can be set, as controlled by registers 136, after the microcode instructions has been stored to an array in the memory device 120. In some embodiments, the registers 136 may be memory mapped registers to the unused bit fields 164 in the microcode instructions. The registers may comprise a register interface, e.g., interface 141 in FIGS. 1B and 1C, separate from a double date rate (DDR) control register interface for an array on the memory device 120.

Such registers 136 may be configured to cause one or more debug bits to be set in microcode instructions in response to one or more debugging indications. The debugging indications may be received via an interface 141 on the memory device 120. The one or more indications may correlate the execution of a debugging routine on the memory device 120 with the execution of a debugging routine on a host 110.

According to embodiments, one or more of the debug bit fields 164 in the microcode instructions 163 may contain additional information on the debug routine itself. For example, a first debug bit may be set to signal to a controller 140 to halt execution of the operation associated with that microcode instruction. In one or more embodiments, a sequencer 132 associated with the controller 140 is halted by spinning, e.g., by entering a loop until the detected bit is reset. Other one or more debug bits may be set to signal a debug action and/or routine to execute. As the reader will appreciate, one or more other debug bits may be set to signal a debug routine to execute a step, single step, or step over debugging action. For example, a single step debugging action may include executing a debugging routine until the sequencer 132 reaches a next microcode instruction. Alternatively, a step over debugging action may be signaled in which the debugging routine runs on one microcode instruction, steps over a next microcode instruction, and continues on a subsequent microcode instruction. In the example of FIG. 1F, three (3) microcode instruction lines are illustrated, e.g., 0, 1, and 2. Hence in the step over debugging action, a debugging routine would be conducted for the operation associated with microcode instruction 0, microcode instruction 1 would be stepped over and the debugging routine would continue to be conducted for the operation associated with microcode instruction 2 (as shown by the "arrow").

As noted above, such debug bits can be present on one or a multiple of microcode instructions. In normal execution, no operation has the one or more debug bits set. In the development environment, the debug bit fields 164 can be set programmatically, in the download of the microcode sequence. In another embodiment, e.g., in the field, the registers 136 are configured and used to cause one or more debug bits to be set in microcode instructions in response to receipt of one or more debugging indications. Embodiments are not limited to the examples given herein.

In various embodiments, the sequencer 132 of a controller 140 is configured to identify whether a debug bit has been set. If the sequencer 132 detects that a given debug bit is set, a program counter associated with the sequencer 132 can be stopped and new instructions prevented from executing. In some embodiments, a user may have to manually restart/resume the executing sequence once the debugging routine is complete. Accordingly, a programmer may add and/or remove breakpoint indications from the microcode instructions together with examining debug register results. In an alternative embodiment, breakpoint indications may be added and/or removed from the microcode instructions in response to receipt of a debugging indication to the memory device 120 in parallel with debugging instructions being executed on a separate host 110.

FIGS. 2-4 illustrate additional functionality of a PIM device, e.g., bit vector operation capable memory device, according to one or more embodiments of the present disclosure. FIG. 2 is a schematic diagram illustrating sensing circuitry 250 in accordance with a number of embodiments of the present disclosure. The sensing circuitry 250 can correspond to sensing circuitry 150 shown in FIG. 1A. A memory cell comprises a storage element (e.g., capacitor) and an access device (e.g., transistor). For instance, a first memory cell comprises transistor 202-1 and capacitor 203-1, and a second memory cell comprises transistor 202-2 and capacitor 203-2, etc. In this example, the memory array 230 is a DRAM array of 1T1C (one transistor one capacitor) memory cells. In a number of embodiments, the memory cells may be destructive read memory cells (e.g., reading the data stored in the cell destroys the data such that the data originally stored in the cell is refreshed after being read).

The cells of the memory array 230 can be arranged in rows coupled by word lines 204-X (Row X), 204-Y (Row Y), etc., and columns coupled by pairs of complementary sense lines (e.g., data lines DIGIT(n−1)/DIGIT(n−1)_, DIGIT(n)/DIGIT(n)_, DIGIT(n+1)/DIGIT(n+1)_). The individual sense lines corresponding to each pair of complementary sense lines can also be referred to as data lines 205-1 (D) and 205-2 (D_) respectively. Although only one pair of complementary data lines are shown in FIG. 2, embodiments of the present disclosure are not so limited, and an array of memory cells can include additional columns of memory cells and/or data lines (e.g., 4,096, 8,192, 16,384, etc.).

Memory cells can be coupled to different data lines and/or word lines. For example, a first source/drain region of a transistor 202-1 can be coupled to data line 205-1 (D), a second source/drain region of transistor 202-1 can be coupled to capacitor 203-1, and a gate of a transistor 202-1 can be coupled to word line 204-Y. A first source/drain region of a transistor 202-2 can be coupled to data line 205-2 (D_), a second source/drain region of transistor 202-2 can be coupled to capacitor 203-2, and a gate of a transistor 202-2 can be coupled to word line 204-X. The cell plate, as shown in FIG. 2, can be coupled to each of capacitors 203-1 and 203-2. The cell plate can be a common node to which a reference voltage (e.g., ground) can be applied in various memory array configurations.

The memory array 230 is coupled to sensing circuitry 250 in accordance with a number of embodiments of the present disclosure. In this example, the sensing circuitry 250 comprises a sense amplifier 206 and a compute component 231 corresponding to respective columns of memory cells (e.g., coupled to respective pairs of complementary data lines). The sense amplifier 206 can be coupled to the pair of complementary sense lines 205-1 and 205-2. The compute component 231 can be coupled to the sense amplifier 206 via pass gates 207-1 and 207-2. The gates of the pass gates 207-1 and 207-2 can be coupled to logical operation selection logic 213.

The logical operation selection logic 213 can be configured to include pass gate logic for controlling pass gates that couple the pair of complementary sense lines un-transposed between the sense amplifier 206 and the compute component 231 (as shown in FIG. 2) and/or swap gate logic for controlling swap gates that couple the pair of complementary sense lines transposed between the sense amplifier 206 and the compute component 231. The logical operation selection logic 213 can also be coupled to the pair of complementary sense lines 205-1 and 205-2. The logical operation selection logic 213 can be configured to control continuity of pass gates 207-1 and 207-2 based on a selected logical operation, as described in detail below for various configurations of the logical operation selection logic 213.

The sense amplifier 206 can be operated to determine a data value (e.g., logic state) stored in a selected memory cell.

The sense amplifier 206 can comprise a cross coupled latch, which can be referred to herein as a primary latch. In the example illustrated in FIG. 2, the circuitry corresponding to sense amplifier 206 comprises a latch 215 including four transistors coupled to a pair of complementary data lines D 205-1 and D_ 205-2. However, embodiments are not limited to this example. The latch 215 can be a cross coupled latch (e.g., gates of a pair of transistors, such as n-channel transistors (e.g., NMOS transistors) 227-1 and 227-2 are cross coupled with the gates of another pair of transistors, such as p-channel transistors (e.g., PMOS transistors) 229-1 and 229-2). The cross coupled latch 215 comprising transistors 227-1, 227-2, 229-1, and 229-2 can be referred to as a primary latch.

In operation, when a memory cell is being sensed (e.g., read), the voltage on one of the data lines 205-1 (D) or 205-2 (D_) will be slightly greater than the voltage on the other one of data lines 205-1 (D) or 205-2 (D_). An ACT signal and the RNL* signal can be driven low to enable (e.g., fire) the sense amplifier 206. The data lines 205-1 (D) or 205-2 (D_) having the lower voltage will turn on one of the PMOS transistor 229-1 or 229-2 to a greater extent than the other of PMOS transistor 229-1 or 229-2, thereby driving high the data line 205-1 (D) or 205-2 (D_) having the higher voltage to a greater extent than the other data line 205-1 (D) or 205-2 (D_) is driven high.

Similarly, the data line 205-1 (D) or 205-2 (D_) having the higher voltage will turn on one of the NMOS transistor 227-1 or 227-2 to a greater extent than the other of the NMOS transistor 227-1 or 227-2, thereby driving low the data line 205-1 (D) or 205-2 (D_) having the lower voltage to a greater extent than the other data line 205-1 (D) or 205-2 (D_) is driven low. As a result, after a short delay, the data line 205-1 (D) or 205-2 (D_) having the slightly greater voltage is driven to the voltage of the supply voltage $V_{CC}$ through source transistor 211, and the other data line 205-1 (D) or 205-2 (D_) is driven to the voltage of the reference voltage (e.g., ground) through the sink transistor 213. Therefore, the cross coupled NMOS transistors 227-1 and 227-2 and PMOS transistors 229-1 and 229-2 serve as a sense amplifier pair, which amplify the differential voltage on the data lines 205-1 (D) and 205-2 (D_) and operate to latch a data value sensed from the selected memory cell.

Embodiments are not limited to the sense amplifier 206 configuration illustrated in FIG. 2. As an example, the sense amplifier 206 can be current-mode sense amplifier and/or single-ended sense amplifier (e.g., sense amplifier coupled to one data line). Also, embodiments of the present disclosure are not limited to a folded data line architecture such as that shown in FIG. 2.

The sense amplifier 206 can, in conjunction with the compute component 231, be operated to perform various logical operations using data from an array as input. In a number of embodiments, the result of a logical operation can be stored back to the array without transferring the data via a data line address access (e.g., without firing a column decode signal such that data is transferred to circuitry external from the array and sensing circuitry via local I/O lines). As such, a number of embodiments of the present disclosure can enable performing logical operations and compute functions associated therewith using less power than various previous approaches. Additionally, since a number of embodiments eliminate the need to transfer data across I/O lines in order to perform compute functions (e.g., between memory and discrete processor), a number of embodiments can enable an increased parallel processing capability as compared to previous approaches.

The sense amplifier 206 can further include equilibration circuitry 214, which can be configured to equilibrate the data lines 205-1 (D) and 205-2 (D_). In this example, the equilibration circuitry 214 comprises a transistor 224 coupled between data lines 205-1 (D) and 205-2 (D_). The equilibration circuitry 214 also comprises transistors 225-1 and 225-2 each having a first source/drain region coupled to an equilibration voltage (e.g., $V_{DD}/2$), where $V_{DD}$ is a supply voltage associated with the array. A second source/drain region of transistor 225-1 can be coupled data line 205-1 (D), and a second source/drain region of transistor 225-2 can be coupled data line 205-2 (D_)). Gates of transistors 224, 225-1, and 225-2 can be coupled together, and to an equilibration (EQ) control signal line 226. As such, activating EQ enables the transistors 224, 225-1, and 225-2, which effectively shorts data lines 205-1 (D) and 205-2 (D_) together and to the an equilibration voltage (e.g., $V_{DD}/2$).

Although FIG. 2 shows sense amplifier 206 comprising the equilibration circuitry 214, embodiments are not so limited, and the equilibration circuitry 214 may be implemented discretely from the sense amplifier 206, implemented in a different configuration than that shown in FIG. 2, or not implemented at all.

As described further below, in a number of embodiments, the sensing circuitry 250 (e.g., sense amplifier 206 and compute component 231) can be operated to perform a selected logical operation and initially store the result in one of the sense amplifier 206 or the compute component 231 without transferring data from the sensing circuitry via an I/O line (e.g., without performing a data line address access via activation of a column decode signal, for instance).

Performance of logical operations (e.g., Boolean logical functions involving data values) is fundamental and commonly used. Boolean logic functions are used in many higher level functions. Consequently, speed and/or power efficiencies that can be realized with improved logical operations, can translate into speed and/or power efficiencies of higher order functionalities.

As shown in FIG. 2, the compute component 231 can also comprise a latch, which can be referred to herein as a secondary latch 264. The secondary latch 264 can be configured and operated in a manner similar to that described above with respect to the primary latch 215, with the exception that the pair of cross coupled p-channel transistors (e.g., PMOS transistors) comprising the secondary latch can have their respective sources coupled to a supply voltage (e.g., $V_{DD}$), and the pair of cross coupled n-channel transistors (e.g., NMOS transistors) of the secondary latch can have their respective sources selectively coupled to a reference voltage (e.g., ground), such that the secondary latch is continuously enabled. The configuration of the compute component is not limited to that shown in FIG. 2 at 231, and various other embodiments are described further below.

FIG. 3 is a schematic diagram illustrating sensing circuitry capable of implementing an XOR logical operation in accordance with a number of embodiments of the present disclosure. FIG. 3 shows a sense amplifier 306 coupled to a pair of complementary sense lines 305-1 and 305-2, and a compute component 331 coupled to the sense amplifier 306 via pass gates 307-1 and 307-2. The sense amplifier 306 shown in FIG. 3 can correspond to sense amplifier 206 shown in FIG. 2. The compute component 331 shown in FIG. 3 can correspond to sensing circuitry 150, including compute component, shown in FIG. 1A, for example. The logical operation selection logic 313 shown in FIG. 3 can correspond to logical operation selection logic 213 shown in FIG. 2.

The gates of the pass gates 307-1 and 307-2 can be controlled by a logical operation selection logic signal, Pass. For example, an output of the logical operation selection logic can be coupled to the gates of the pass gates 307-1 and 307-2. The compute component 331 can comprise a loadable shift register configured to shift data values left and right.

According to the embodiment illustrated in FIG. 3, the compute components 331 can comprise respective stages (e.g., shift cells) of a loadable shift register configured to shift data values left and right. For example, as illustrated in FIG. 3, each compute component 331 (e.g., stage) of the shift register comprises a pair of right-shift transistors 381 and 386, a pair of left-shift transistors 389 and 390, and a pair of inverters 387 and 388. The signals PHASE 1R, PHASE 2R, PHASE 1L, and PHASE 2L can be applied to respective control lines 382, 383, 391 and 392 to enable/disable feedback on the latches of the corresponding compute components 331 in association with performing logical operations and/or shifting data in accordance with embodiments described herein.

The sensing circuitry shown in FIG. 3 also shows a logical operation selection logic 313 coupled to a number of logic selection control input control lines, including ISO, TF, TT, FT, and FF. Selection of a logical operation from a plurality of logical operations is determined from the condition of logic selection control signals on the logic selection control input control lines, as well as the data values present on the pair of complementary sense lines 305-1 and 305-2 when the isolation transistors 350-1 and 350-2 are enabled via the ISO control signal being asserted.

According to various embodiments, the logical operation selection logic 313 can include four logic selection transistors: logic selection transistor 362 coupled between the gates of the swap transistors 342 and a TF signal control line, logic selection transistor 352 coupled between the gates of the pass gates 307-1 and 307-2 and a TT signal control line, logic selection transistor 354 coupled between the gates of the pass gates 307-1 and 307-2 and a FT signal control line, and logic selection transistor 364 coupled between the gates of the swap transistors 342 and a FF signal control line. Gates of logic selection transistors 362 and 352 are coupled to the true sense line through isolation transistor 350-1 (having a gate coupled to an ISO signal control line). Gates of logic selection transistors 364 and 354 are coupled to the complementary sense line through isolation transistor 350-2 (also having a gate coupled to an ISO signal control line).

Data values present on the pair of complementary sense lines 305-1 and 305-2 can be loaded into the compute component 331 via the pass gates 307-1 and 307-2. The compute component 331 can comprise a loadable shift register. When the pass gates 307-1 and 307-2 are OPEN, data values on the pair of complementary sense lines 305-1 and 305-2 are passed to the compute component 331 and thereby loaded into the loadable shift register. The data values on the pair of complementary sense lines 305-1 and 305-2 can be the data value stored in the sense amplifier 306 when the sense amplifier is fired. The logical operation selection logic signal, Pass, is high to OPEN the pass gates 307-1 and 307-2.

The ISO, TF, TT, FT, and FF control signals can operate to select a logical function to implement based on the data value ("B") in the sense amplifier 306 and the data value ("A") in the compute component 331. In particular, the ISO, TF, TT, FT, and FF control signals are configured to select the logical function to implement independent from the data value present on the pair of complementary sense lines 305-1 and 305-2 (although the result of the implemented logical operation can be dependent on the data value present on the pair of complementary sense lines 305-1 and 305-2. For example, the ISO, TF, TT, FT, and FF control signals select the logical operation to implement directly since the data value present on the pair of complementary sense lines 305-1 and 305-2 is not passed through logic to operate the gates of the pass gates 307-1 and 307-2.

Additionally, FIG. 3 shows swap transistors 342 configured to swap the orientation of the pair of complementary sense lines 305-1 and 305-2 between the sense amplifier 306 and the compute component 331. When the swap transistors 342 are OPEN, data values on the pair of complementary sense lines 305-1 and 305-2 on the sense amplifier 306 side of the swap transistors 342 are oppositely-coupled to the pair of complementary sense lines 305-1 and 305-2 on the compute component 331 side of the swap transistors 342, and thereby loaded into the loadable shift register of the compute component 331.

The logical operation selection logic signal Pass can be activated (e.g., high) to OPEN the pass gates 307-1 and 307-2 (e.g., conducting) when the ISO control signal line is activated and either the TT control signal is activated (e.g., high) and data value on the true sense line is "1" or the FT control signal is activated (e.g., high) and the data value on the complement sense line is "1."

The data value on the true sense line being a "1" OPENs logic selection transistors 352 and 362. The data value on the complimentary sense line being a "1" OPENs logic selection transistors 354 and 364. If the ISO control signal or either the respective TT/FT control signal or the data value on the corresponding sense line (e.g., sense line to which the gate of the particular logic selection transistor is coupled) is not high, then the pass gates 307-1 and 307-2 will not be OPENed by a particular logic selection transistor.

The logical operation selection logic signal Pass* can be activated (e.g., high) to OPEN the swap transistors 342 (e.g., conducting) when the ISO control signal line is activated and either the TF control signal is activated (e.g., high) and data value on the true sense line is "1," or the FF control signal is activated (e.g., high) and the data value on the complement sense line is "1." If either the respective control signal or the data value on the corresponding sense line (e.g., sense line to which the gate of the particular logic selection transistor is coupled) is not high, then the swap transistors 342 will not be OPENed by a particular logic selection transistor.

The Pass* control signal is not necessarily complementary to the Pass control signal. It is possible for the Pass and Pass* control signals to both be activated or both be deactivated at the same time. However, activation of both the Pass and Pass* control signals at the same time shorts the pair of complementary sense lines together, which may be a disruptive configuration to be avoided.

The sensing circuitry illustrated in FIG. 3 is configured to select one of a plurality of logical operations to implement directly from the four logic selection control signals (e.g., logical operation selection is not dependent on the data value present on the pair of complementary sense lines). Some combinations of the logic selection control signals can cause both the pass gates 307-1 and 307-2 and swap transistors 342 to be OPEN at the same time, which shorts the pair of complementary sense lines 305-1 and 305-2 together. According to a number of embodiments of the present disclosure, the logical operations which can be implemented by the sensing circuitry illustrated in FIG. 3 can be the logical operations summarized in the logic tables shown in FIG. 4.

FIG. 4 is a logic table illustrating selectable logic operation results implemented by a sensing circuitry shown in FIG. 3 in accordance with a number of embodiments of the present disclosure. The four logic selection control signals (e.g., TF, TT, FT, and FF), in conjunction with a particular data value present on the complementary sense lines, can be used to select one of plural logical operations to implement involving the starting data values stored in the sense amplifier 306 and compute component 331. The four control signals, in conjunction with a particular data value present on the complementary sense lines, controls the continuity of the pass gates 307-1 and 307-2 and swap transistors 342, which in turn affects the data value in the compute component 331 and/or sense amplifier 306 before/after firing. The capability to selectably control continuity of the swap transistors 342 facilitates implementing logical operations involving inverse data values (e.g., inverse operands and/or inverse result), among others.

Logic Table 4-1 illustrated in FIG. 4 shows the starting data value stored in the compute component 331 shown in column A at 444, and the starting data value stored in the sense amplifier 306 shown in column B at 445. The other 3 column headings in Logic Table 4-1 refer to the continuity of the pass gates 307-1 and 307-2, and the swap transistors 342, which can respectively be controlled to be OPEN or CLOSED depending on the state of the four logic selection control signals (e.g., TF, TT, FT, and FF), in conjunction with a particular data value present on the pair of complementary sense lines 305-1 and 305-2. The "Not Open" column corresponds to the pass gates 307-1 and 307-2 and the swap transistors 342 both being in a non-conducting condition, the "Open True" corresponds to the pass gates 307-1 and 307-2 being in a conducting condition, and the "Open Invert" corresponds to the swap transistors 342 being in a conducting condition. The configuration corresponding to the pass gates 307-1 and 307-2 and the swap transistors 342 both being in a conducting condition is not reflected in Logic Table 4-1 since this results in the sense lines being shorted together.

Via selective control of the continuity of the pass gates 307-1 and 307-2 and the swap transistors 342, each of the three columns of the upper portion of Logic Table 4-1 can be combined with each of the three columns of the lower portion of Logic Table 4-1 to provide 3×3=9 different result combinations, corresponding to nine different logical operations, as indicated by the various connecting paths shown at 475. The nine different selectable logical operations that can be implemented by the sensing circuitry, e.g., 150 in FIG. 1A, are summarized in Logic Table 4-2 illustrated in FIG. 4, including an XOR logical operation.

The columns of Logic Table 4-2 illustrated in FIG. 4 show a heading 480 that includes the state of logic selection control signals. For example, the state of a first logic selection control signal is provided in row 476, the state of a second logic selection control signal is provided in row 477, the state of a third logic selection control signal is provided in row 478, and the state of a fourth logic selection control signal is provided in row 479. The particular logical operation corresponding to the results is summarized in row 447.

While example embodiments including various combinations and configurations of sensing circuitry, sense amplifiers, compute component, dynamic latches, isolation devices, and/or shift circuitry have been illustrated and described herein, embodiments of the present disclosure are not limited to those combinations explicitly recited herein. Other combinations and configurations of the sensing circuitry, sense amplifiers, compute component, dynamic latches, isolation devices, and/or shift circuitry disclosed herein are expressly included within the scope of this disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A system, comprising:
a host configured to generate instructions;
a memory device coupled to the host and comprising:
  a memory array;
  sensing circuitry coupled to the memory array, the sensing circuitry further comprising:
    a sense amplifier;
    a compute component configured to perform logical operations;
    a controller coupled to the memory array and the sensing circuitry, the controller configured to detect one or more debug bits stored in microcode instructions within the memory device, wherein the controller is configured to retrieve the debug bits from a register on the memory device and set the debug bits in the microcode instructions after the microcode instructions are first stored in the memory array, the register being associated with an interface on the memory device;
  the interface configured to receive a debugging indication, provided concurrently to the host and the memory device, in order to correlate debugging instructions on the processing in memory device and the host; and
  the sensing circuitry operated by the controller to execute the debugging instructions directly on the memory device, separate from the host, upon receipt of the debugging indication.

2. The system of claim 1, wherein the interface on the memory device is configured to accept the debugging instructions from the host.

3. The system of claim 1, wherein the controller halts a logical operation being performed by the sensing circuitry operated by the controller executing the microcode instructions stored on the array of the memory device.

4. The system of claim 1, wherein the controller is configured to execute a debugging routine, with an identical process, on the microcode instructions on the memory device, concurrently with executing the debugging routine on the host.

5. The system of claim 1, wherein the controller is configured to detect the debugging indication, received to the interface and triggered by a debug bit set in the microcode instructions, and to halt an operation being performed by execution of the microcode instructions on the memory device, in order and to execute a debugging routine.

6. The system of claim 1, wherein the controller is configured to cause the memory device to perform logical operations using the sensing circuitry.

7. The system of claim 1, wherein the controller is configured, upon receipt of the of the debugging indication to the interface, to execute a step debugging operation on the memory device in correlation with a step debugging operation being executed by the host.

8. The system of claim 1, wherein the controller stores the microcode instructions in the memory array and causes the memory device to execute logical operations in the sensing circuitry and execute microcode instructions on the memory device.

9. The system of claim 8, wherein upon receipt of the debugging indication, the controller uses the compute component to pause the logical operations on the memory device.

10. A system comprising;
a memory device comprising an array of memory cells;
sensing circuitry coupled to the array of memory cells, the sensing circuitry comprising:
  a sense amplifier; and
  a compute component configured to perform logical operations;
  a controller coupled to the array of memory cells and sensing circuitry and, the controller is configured to cause performance of logical operations using the sensing circuitry and to detect one or more debug bits stored in microcode instructions on the memory device, the controller is configured to retrieve one or more debug bits from storable in one or more registers on the memory device after the microcode instructions are stored in the memory array; and
  an interface associated with the one or more registers configured to cause the one or more debug bits to be set in microcode instructions upon receipt of a debugging indication, and wherein the controller is configured to halt a logical operation being performed by the sensing circuitry operated by the controller directly on the memory device, separate from a host, to execute the microcode instructions stored in the array of memory cells on the memory device and retrieving and executing debugging code from the microcode instructions to perform a debugging routine directly on the memory device using the sensing circuitry.

11. The system of claim 10, wherein the controller receives an indication to perform a debugging routine by setting a debug bit in the microcode instructions sored in the array of memory cells.

12. The system of claim 10, wherein one or more debug bits is present within a plurality of microcode instructions.

13. The system of claim 10, wherein the system further comprises logic circuitry coupled to the sensing circuitry to receive debugging results.

14. The system of claim 10, wherein the system further comprises:
 a plurality of subarrays;
 a plurality of banks to store the microcode instructions; and
 a bank controller.

15. The system of claim 14, wherein the system allocates the microcode instructions to the plurality of subarrays and the bank controller is configured to retrieve the microcode instruction from the subarrays, cache the microcode instructions and refilling the microcode instructions.

16. A method for debugging on a memory device, comprising:
 generating instruction by a host, the host coupled to the memory device;
 performing logical operations in a sensing circuitry;
 detecting, via a controller, debugging bits in microcode instructions on the memory device, wherein the debugging bits are retrieved from a register on the memory and set in the microcode instructions after the microcode instructions are stored in the memory array, the register associated with an interface on the memory device; and
 receiving a debugging indication and performing a debugging routine concurrently on the host and the memory device to directly execute debugging instructions on the host and memory device using the sensing circuitry operated by the controller, separate from the host.

17. The method of claim 16, wherein the method further comprises halting the logical operation being performed by the sensing circuitry executing the microcode instructions stored in an array of memory cells on the memory device and retrieving and executing debugging code from the microcode instructions to perform a debugging routine directly on the processing in memory device using the sensing circuitry.

* * * * *